(12) United States Patent
Haruta et al.

(10) Patent No.: US 6,690,564 B1
(45) Date of Patent: Feb. 10, 2004

(54) ANISOTROPICALLY CONDUCTIVE SHEET, PRODUCTION PROCESS THEREOF AND CONNECTOR

(75) Inventors: Yuichi Haruta, Tokyo (JP); Naoshi Yasuda, Tokyo (JP)

(73) Assignee: JSR Corporation, Tokyo (JP)

( * ) Notice: Subject to any disclaimer, the term of this patent is extended or adjusted under 35 U.S.C. 154(b) by 503 days.

(21) Appl. No.: 09/662,122

(22) Filed: Sep. 14, 2000

(30) Foreign Application Priority Data

Sep. 17, 1999 (JP) .......................................... 11/263438
Sep. 21, 1999 (JP) .......................................... 11/266865
Dec. 28, 1999 (JP) .......................................... 11/375648

(51) Int. Cl.$^7$ ............................................... H02H 1/00
(52) U.S. Cl. ....................................... 361/212; 361/220
(58) Field of Search ................................ 361/220, 212, 361/56, 58, 115, 100, 127

(56) References Cited

U.S. PATENT DOCUMENTS 5,140,405 A * 8/1992 King et al. .................. 257/727
5,162,613 A * 11/1992 Schoenthaler ............. 174/88 R
5,975,915 A * 11/1999 Yamazaki et al. ............ 439/72

FOREIGN PATENT DOCUMENTS

| JP | 51-93393 | 8/1976 |
| JP | 53-147772 | 12/1978 |
| JP | 61-250906 | 11/1986 |
| JP | 4-65450 | 3/1992 |

* cited by examiner

*Primary Examiner*—Stephen W. Jackson

(57) ABSTRACT

Disclosed herein is an anisotropically conductive sheet that exhibits conductivity in its thickness-wise direction, and is suitably used as a connector.

The anisotropically conductive sheet of the first feature may comprise a plurality of columner conductive parts extending in the thickness-wise direction and a semiconductive part that exhibits semiconductivity in its plane direction. In the sheet, respective conductive parts may be surrounded by the semiconductive part with an insulating part therebetween. The sheet may comprise conductive particles contained in a sheet member exhibiting semiconductivity in a state oriented so as to be arranged in the thickness-wise direction thereof.

The sheet of the second feature has a static charge-eliminating layer integrally provided on the surface of a sheet member.

The sheet of the third feature has a conductive part for static-charge elimination to be connected to a ground.

The sheet can inhibit static electricity from being accumulated on the surface thereof.

19 Claims, 20 Drawing Sheets

ANISOTROPICALLY CONDUCTIVE SHEET, PRODUCTION PROCESS THEREOF AND CONNECTOR

BACKGROUND OF THE INVENTION

1. Field of the Invention

The present invention relates to an anisotropically conductive sheet suitable for use, for example, in electrical connection between circuit devices such as electronic parts, or as a connector in inspection apparatus for circuit devices such as printed circuit boards and semiconductor integrated circuits, a production process thereof, and a connector.

2. Description of the Background Art

An anisotropically conductive elastomer sheet has a conductor exhibiting conductivity only in its thickness-wise direction or a pressure-conductive conductor exhibiting conductivity only in its thickness-wise direction when it is pressurized in the thickness-wise direction. Since the anisotropically conductive elastomer sheet has features that compact electrical connection can be achieved without using any means such as soldering or mechanical fitting, and that soft connection is feasible with mechanical shock or strain absorbed therein, it is widely used as a connector for achieving electrical connection between a circuit device, for example, a printed circuit board, and a leadless chip carrier, liquid crystal display panel or the like in fields of, for example, electronic computers, electronic digital clocks, electronic cameras and computer key boards.

The anisotropically conductive elastomer sheet is also used as a sensor for detecting external force in a key board, touch switch or the like.

Further, in electrical inspection for electronic circuits or semiconductor integrated circuits fabricated by various materials in accordance with various methods, such as printed circuit boards, flexible boards, ceramic boards or a carrier tape for TAB, or MCM in which a plurality of semiconductor integrated circuits are incorporated into a module, it is conducted to interpose an anisotropically conductive elastomer sheet between an electrode region to be inspected and an electrode region for inspection in order to achieve electrical connection between electrodes to be inspected formed on at least one surface of a circuit device which is a inspection subject and electrodes for inspection formed on the surface of a circuit board for inspection.

As such anisotropically conductive elastomer sheets, there have heretofore been known those of various structures. For example, Japanese Patent Application Laid-Open No. 93393/1976 discloses anisotropically conductive elastomer sheets obtained by uniformly dispersing metal particles in an elastomer, Japanese Patent Application Laid-Open No. 147772/1978 discloses anisotropically conductive elastomer sheets obtained by unevenly distributing particles of a conductive magnetic material in an elastomer to form many conductive path-forming parts extending in the thickness-wise direction thereof and insulating parts for mutually insulating them, and Japanese Patent Application Laid-Open No. 250906/1986 discloses anisotropically conductive elastomer sheets with a difference in level defined between the surface of the conductive path-forming parts and the insulating parts.

However, since an anisotropically conductive sheet has conductivity in its thickness-wise direction and insulating property in its plane direction, static electricity is generated on the surface of the anisotropically conductive sheet according to manner of usage or service environment to offer various problems due to charging.

For example, when an anisotropically conductive sheet is used in electrical inspection for circuit devices, the anisotropically conductive sheet is interposed between a circuit device (hereinafter may be referred to as "circuit device to be inspected") which is an inspection subject to be inspected and a circuit board for inspection, the anisotropically conductive sheet is pressurized, thereby achieving electrical connection between the circuit device to be inspected and the circuit board for inspection to conduct electrical inspection. However, an electric charge is easy to generate by pressurizing operation and separation operation, so that when the electrical inspection of a great number of circuit devices to be inspected is continuously conducted, the electric charge is accumulated on the surface of the anisotropically conductive sheet which comes to bear high-voltage static electricity.

When the electric charge is accumulated on the surface of the anisotropically conductive sheet to bear the static electricity, the circuit device to be inspected is stuck on the anisotropically conductive sheet by such static electricity. It is thus difficult to smoothly conduct the inspecting operation. When high-voltage static electricity is accumulated on the anisotropically conductive sheet, inconvenience is encountered on the security of operator's safety. When extremely high-voltage static electricity is accumulated in particular, an adverse influence by discharge of the static electricity may be exerted on not only the inspection apparatus and the anisotropically conductive sheet, but also the circuit device to be inspected in some cases. As a result, there is a possibility that the circuit board for inspection and inspection apparatus may go wrong, or the circuit device to be inspected may be broken.

For such reasons, it is necessary to stop inspecting operation periodically or as needed at the time the generation of static electricity is observed on the surface of the anisotropically conductive sheet, so as to conduct static charge-eliminating operation by means of a static charge eliminating brush or the like. Therefore, there is a problem that inspection efficiency is lowered.

SUMMARY OF THE INVENTION

The present invention has been made on the basis of the foregoing circumstances and has as the first object the provision of an anisotropically conductive sheet capable of preventing or inhibiting it from being charged by generation of static electricity on the surface thereof.

The second object of the present invention is to provide a process for producing an anisotropically conductive sheet capable of preventing or inhibiting it from being charged by generation of static electricity on the surface thereof.

In the first aspect of the present invention, there is provided an anisotropically conductive sheet that exhibits conductivity in its thickness-wise direction, which comprises a semiconductive part that exhibits semiconductivity in the plane direction of the sheet.

In the anisotropically conductive sheet according to the first aspect of the present invention, the volume resistivity of the semiconductive part may preferably be $10^{-7}$ to $10^4$ $\Omega$m.

The surface resistivity of the semiconductive part may preferably be $10^-$ to $10^{10}$ $\Omega/\square$ (ohm per square).

In the first aspect of the present invention, there is also provided an anisotropically conductive sheet comprising a plurality of conductive parts each extending in the thickness-wise direction of the sheet and semiconductive parts each exhibiting semiconductivity in the plane direction of the sheet and formed so as to surround each of the conductive parts.

In the first aspect of the present invention, there is further provided an anisotropically conductive sheet comprising a plurality of conductive parts each extending in the thickness-wise direction of the sheet, insulating parts formed so as to surround each of the conductive parts, and semiconductive parts each exhibiting semiconductivity in the plane direction of the sheet and formed so as to surround each of the insulating parts.

In the first aspect of the present invention, there is still further provided an anisotropically conductive sheet comprising a base sheet exhibiting semiconductivity in its plane direction and conductive particles contained in the base sheet in a state oriented so as to be arranged in the thickness-wise direction of the base sheet.

In the anisotropically conductive sheets according to the first aspect of the present invention, the semiconductive parts or base sheet may preferably contain at least one conductive substance selected from among conductive organic substances, amine type organic conductive substances, conductive polymers, metallic particles and carbon black.

In the first aspect of the present invention, there is yet still further provided a process for producing an anisotropically conductive sheet, which comprises the steps of forming a sheet-forming material layer with conductive particles which exhibit magnetism, and a semiconductivity-imparting substance contained in a polymer-forming material which will become an elastic polymeric substance by curing, applying a parallel magnetic field having an intensity distribution to the sheet-forming material layer in the thickness-wise direction thereof and subjecting the sheet-forming material layer to a curing treatment.

In the first aspect of the present invention, there is yet still further provided a process for producing an anisotropically conductive sheet, which comprises the steps of providing a sheet for semiconductive part exhibiting semiconductivity, in which through-holes or openings have been formed, forming a layer of a material for conductive part containing conductive particles, which exhibit magnetism, in a polymer-forming material which will become an elastic polymeric substance by curing, in each of the through-holes or openings in the sheet for semiconductive part, applying a parallel magnetic field or a parallel magnetic field having an intensity distribution to the layer of the material for conductive part in the thickness-wise direction thereof and subjecting the layer of the material for conductive part to a curing treatment.

In the first aspect of the present invention, there is yet still further provided a process for producing an anisotropically conductive sheet, which comprises the steps of forming a sheet-forming material layer with conductive particles which exhibit magnetism, and a semiconductivity-imparting substance contained in a polymer-forming material which will become an elastic polymeric substance by curing, applying a parallel magnetic field to the sheet-forming material layer in the thickness-wise direction thereof and subjecting the sheet-forming material layer to a curing treatment.

Since each of the anisotropically conductive sheets according to the first aspect of the present invention has the semiconductive parts which exhibit semiconductivity in the plane direction thereof, at the surface thereof, the elimination of static charge is conducted through the semiconductive parts by grounding the semiconductive parts, so that the anisotropically conductive sheet is prevented or inhibited from being charged by generation of static electricity on the surface thereof.

In the second aspect of the present invention, there is provided an anisotropically conductive sheet comprising an anisotropically conductive sheet member having conductivity in its thickness-wise direction and a static charge-eliminating layer integrally provided on at least one surface of the sheet member.

In the second aspect of the present invention, there is also provided an anisotropically conductive sheet comprising an anisotropically conductive sheet member provided with a plurality of conductive parts each extending in the thickness-wise direction of the sheet member in a state mutually insulated by insulating parts, and a static charge-eliminating layer provided on at least one surface of each of the insulating parts in the sheet member.

In such an anisotropically conductive sheet, the static charge-eliminating layer may preferably be provided on the insulating parts in the sheet member.

A recess may be formed in at least one surface of each of the insulating parts in the sheet member, and the static charge-eliminating layer may be provided in the recess.

In the anisotropically conductive sheet according to the second aspect of the present invention, the static charge-eliminating layer may preferably be composed of a layer containing a conductive organic substance, amine type organic conductive substance, metal or carbon black, a layer of a thermosetting resin or thermoplastic resin containing a conductive substance therein, or a layer formed of a conductive polymer.

The static charge-eliminating layer may preferably be formed of a metallic layer.

In the second aspect of the present invention, there is further provided a process for producing an anisotropically conductive sheet, which comprises the steps of preparing a flowable composition for forming a static charge-eliminating layer, which contains a conductive substance, coating a sheet member with the composition for forming the static charge-eliminating layer to form a coating film, and then subjecting the coating film to a fixing treatment, thereby forming the static charge-eliminating layer.

In the second aspect of the present invention, there is still further provided a process for producing an anisotropically conductive sheet, which comprises the steps of preparing a flowable composition for forming a static charge-eliminating layer, which contains a conductive substance and a binder or a curable material which will become a binder, coating a sheet member with the composition for forming the static charge-eliminating layer to form a coating film, and then subjecting the coating film to a drying treatment and/or a curing treatment, thereby forming the static charge-eliminating layer.

In the second aspect of the present invention, there is yet still further provided a process for producing an anisotropically conductive sheet, which comprises the steps of producing a film for static charge-eliminating layer to become a static charge-eliminating layer, and bonding the film for static charge-eliminating layer to a sheet member, thereby forming the static charge-eliminating layer.

In the second aspect of the present invention, there is yet still further provided a process for producing an anisotropically conductive sheet, which comprises the steps of forming a layer to become a static charge-eliminating layer on the molding surface of a mold for forming a sheet member, filling a sheet member-forming material with conductive particles contained in a polymer-forming material which will become an elastic polymeric substance by curing, into the mold to form a layer of the forming material, and subjecting the forming material layer to a curing treatment.

According to the constitution of the second aspect of the present invention, the static charge-eliminating layer is provided on one surface of the sheet member in the anisotropically conductive sheet, so that the anisotropically conductive sheet can be prevented or inhibited from being charged by generation of static electricity on the surface thereof by grounding the static charge-eliminating layer.

In the third aspect of the present invention, there is provided an anisotropically conductive sheet comprising an anisotropically conductive sheet member having conductivity in the thickness-wise direction of the sheet member and formed of an elastic polymeric substance, a conductive part for connection to be connected to an external device or terminal of an electronic part, and at least one conductive part for static-charge elimination to be connected to a ground.

In the above-described anisotropically conductive sheet, the sheet member may preferably be provided with a plurality of conductive parts for connection each extending in the thickness-wise direction of the sheet member in a state mutually insulated by insulating parts, and the conductive part for static-charge elimination may be arranged in a blank region outside a region, in which the conductive part for connection is arranged, in the sheet member.

In this case, the sheet member may be constructed by arranging at least one conductive part for static-charge elimination in a dispersive state in the blank region.

The sheet member may also be constructed by arranging at least one conductive part for static-charge elimination about the region in which the conductive part for connection is arranged.

In the anisotropically conductive sheet according to the third aspect of the present invention, the conductive parts for static-charge elimination may contain at least one conductive substance selected from among metallic particles, conductive metal oxides, conductive organic substances and carbon black.

The conductive parts for static-charge elimination may have the same structure as the conductive part for connection.

The conductive parts for static-charge elimination may have the same composition as the conductive part for connection.

According to the anisotropically conductive sheet according to the third aspect of the present invention, the sheet is connected to a ground through the conductive part for static-charge elimination, so that static electricity is eliminated through the conductive part for static-charge elimination. As a result, the sheet can inhibit static electricity from being accumulated on the surface thereof, thereby excluding an adverse influent of the static electricity on the conductive part for connection. Accordingly, the sheet can be suitably used as a connector for achieving various electrical connections.

The conductive part for static-charge elimination is arranged in the dispersive state in the blank region, whereby static electricity is eliminated through the conductive part for static-charge elimination, so that the anisotropically conductive sheet can be sufficiently inhibited from bearing static electricity throughout the blank region.

The conductive part for static-charge elimination is arranged about the region in which the conductive part for connection is arranged, whereby any discharge could be caused at the conductive part for static-charge elimination even when the static electricity is discharged on the surface of the sheet inconviniently, thereby promptly eliminating static electricity through the conductive part for static-charge elimination. Therefore, the conductive part for connection is not adversely affected.

The above anisotropically conductive sheets according to the present invention are useful as connectors and may be suitably used in testing methods for electrically inspecting circuit devices in particular.

BRIEF DESCRIPTION OF THE DRAWINGS

The above and other objects, features and advantages of the present invention will become apparent from the following description and the appended claims, taken in conjunction with the accompanying drawings, in which:

FIG. 31 is a cross-sectional view illustrating an anisotropically conductive sheet according to Structural Example 7;

FIG. 32 illustrates a state that the anisotropically conductive sheet according to Structural Example 2 has been interposed between a circuit device which is an inspection subject, and a connector plate;

FIG. 33 is a cross-sectional view illustrating an exemplary, anisotropically conductive sheet provided integrally on the surface of a connector plate;

FIG. 41 is a cross-sectional view illustrating a state that a sheet member-forming material has been filled into a mold so as to surround the material for antistatic conductive part;

FIG. 42 is a cross-sectional view illustrating a state that a magnetic field has been applied to the sheet member-forming material;

DETAILED DESCRIPTION OF THE PREFERRED EMBODIMENTS

The present invention will hereinafter be described in details.

First Aspect of the Invention

First Embodiment

Figure 1:
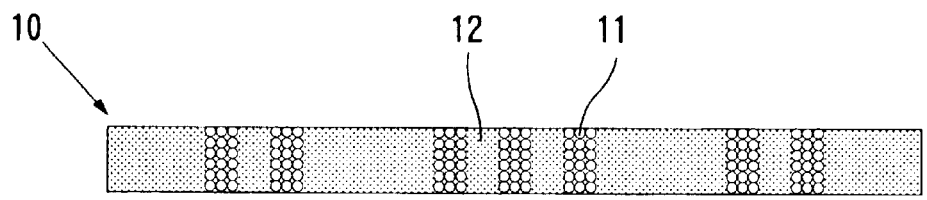
FIG. 1 is a cross-sectional view illustrating the construction of an anisotropically conductive sheet according to the first embodiment in the first aspect of the present invention.

FIG. 1 is a cross-sectional view illustrating the construction of an anisotropically conductive sheet according to the first embodiment in the first aspect of the present invention. In the anisotropically conductive sheet 10, a plurality of columnar conductive parts 11 each extending in the thickness-wise direction of the sheet are arranged along the plane direction thereof according to a pattern corresponding to a pattern of electrodes to be connected, and a semiconductive part or parts 12 are formed so that each of these conductive parts 11 is surrounded thereby.

The conductive parts 11 in this embodiment is constructed by containing conductive particles in a base material composed of an elastic polymeric substance in a state oriented so as to be arranged in the thickness-wise direction of the anisotropically conductive sheet 10.

The elastic polymeric substance forming the base material of the conductive parts 11 is preferably a polymeric substance having a crosslinked structure. As a curable polymeric substance-forming material usable for forming the crosslinked polymeric substance, may be used various materials. Specific examples thereof include conjugated diene rubbers such as polybutadiene rubber, natural rubber, polyisoprene rubber, styrene-butadiene copolymer rubber and acrylonitrile-butadiene copolymer rubber and hydrogenated products thereof; block copolymer rubbers such as styrene-butadiene-diene block copolymer rubber and styrene-isoprene block copolymer rubber and hydrogenated products thereof; and besides chloroprene rubber, urethane rubber, polyester rubber, epichlorohydrin rubber, silicone rubber, ethylene-propylene copolymer rubber and ethylene-propylene-diene copolymer rubber.

When weather resistance is required of the resulting anisotropically conductive sheet, any other material than the conjugated diene rubbers is preferably used. It is particularly preferably to use silicone rubber from the viewpoints of molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reaction in the presence of dimethylvinylchlorosilane or dimethylvinylalkoxysilane and then fractionating the reaction product by, for example, repeated dissolution-precipitation.

Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinylsiloxane as a polymerization terminator and suitably selecting other reaction conditions (for example, amounts of the cyclic siloxane and the polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

Such a vinyl group-containing dimethyl polysiloxane preferably has a molecular weight Mw (weight average molecular weight as determined in terms of standard polystyrene; the same shall apply hereinafter) of 10,000 to 40,000. The polysiloxane also preferably has a molecular weight distribution index (a ratio Mw/Mn of weight average molecular weight Mw as determined in terms of standard polystyrene to number average molecular weight Mn as determined in terms of standard polystyrene; the same shall apply hereinafter) of at most 2 from the viewpoint of the heat resistance of the resulting conductive-path element.

On the other hand, hydroxyl group-containing liquid silicone rubber (hydroxyl group-containing dimethyl polysiloxane) is generally obtained by subjecting dimethyldichlorosilane or dimethyldialkoxysilane to hydrolysis and condensation reaction in the presence of dimethylhydrochlorosilane or dimethylhydroalkoxysilane and then fractionating the reaction product by, for example, repeated dissolution-precipitation.

It is also obtained by subjecting a cyclic siloxane to anionic polymerization in the presence of a catalyst, using, for example, dimethylhydrochlorosiloxane, methyldihydrochlorosilane or dimethylhydroalkoxysilane as a polymerization terminator and suitably selecting other reaction conditions (for example, amounts of the cyclic siloxane and the polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

Such a hydroxyl group-containing dimethyl polysiloxane preferably has a molecular weight Mw of 10,000 to 40,000. The polysiloxane also preferably has a molecular weight distribution index of at most 2 from the viewpoint of the heat resistance of the resulting conductive-path element.

In the first aspect of the present invention, the above-described vinyl group-containing dimethyl polysiloxane and hydroxyl group-containing dimethyl polysiloxane may be used either singly or in combination.

In the first aspect of the present invention, a suitable curing catalyst may be used to cure the polymeric substance-forming material. As such a curing catalyst, may be used an organic peroxide, fatty acid azo compound, hydrosilylation catalyst or the like.

Specific example of the organic peroxide used as the curing catalyst include benzoyl peroxide, bisdicyclobenzoyl peroxide, dicumyl peroxide and di-tert-butyl peroxide.

Specific example of the fatty acid azo compound used as the curing catalyst include azobisisobutyronitrile.

Specific example of that used as the catalyst for hydrosilylation reaction include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of tri-organophosphine or phosphine and platinum, acetyl acetate platinum chelates, and cyclic diene-platinum complexes.

The amount of the curing catalyst used is suitably selected in view of the kind of the polymeric substance-forming material, the kind of the curing catalyst and other curing treatment conditions. However, it is generally 3 to 15 parts by weight per 100 parts by weight of the polymeric substance-forming material.

In the base material of the conductive parts 11, may be contained a general inorganic filler such as silica powder, colloidal silica, aerogel silica or alumina as needed. By containing such an inorganic filler, the thixotropic property of the material for forming the conductive parts 11 is ensured, the viscosity thereof becomes high, the dispersion stability of the conductive particles is enhanced, and moreover the conductive parts 11 can be provided as those having high strength.

No particular limitation is imposed on the amount of such an inorganic filler used. However, the use in a large amount is not preferred because the orientation of the conductive particles by a magnetic field cannot be fully achieved.

As the conductive particles contained in the base material of the conductive parts 11, conductive particles exhibiting magnetism are preferably used from the viewpoint of the fact that they can be oriented with ease so as to be arranged in the thickness-wise direction of the resulting anisotropically conductive sheet 10 by applying a magnetic field thereto. Specific examples of such conductive particles include particles of metals exhibiting magnetism, such as nickel, iron and cobalt, particles of alloys thereof and particles containing such a metal; particles obtained by using these particles as core particles and plating the core particles with a metal having high conductivity, such as gold, silver, palladium or rhodium; particles obtained by using particles of a non-magnetic metal, inorganic particles such as glass beads or polymer particles as core particles and plating the core particles with a conductive magnetic material such as nickel or cobalt; and particles obtained by coating the core particles with both conductive magnetic material and metal having high conductivity. Among these, particles obtained by using nickel particles as core particles and plating them with a metal having high conductivity, such as gold are preferably used.

No particular limitation is imposed on the means for coating the surfaces of the core particles with the conductive metal. However, the coating can be conducted by, for example, chemical plating or electroplating.

When particles obtained by coating the surfaces of metallic core particles with the conductive metal are used as the conductive particles, a coating rate (proportion of coated area by the conductive metal to the whole surface area of the core particles) of the conductive metal on the surfaces of the particles is preferably at least 40%, more preferably at least 45%, particularly preferably 47 to 95% from the viewpoint of achieving desirable conductivity.

The coating amount of the conductive metal is preferably 0.5 to 50% by weight, more preferably 1 to 30% by weight, still more preferably 3 to 25% by weight, particularly preferably 4 to 20% by weight based on the core particles when the core particles are metal particles. When the conductive metal used for the coating is gold, the coating amount of the metal is preferably 2.5 to 30% by weight, more preferably 3 to 20% by weight, still more preferably 3.5 to 15% by weight, particularly preferably 4 to 10% by weight based on the core particles. When the conductive metal used for the coating is silver, the coating amount of the metal is preferably 3 to 50% by weight, more preferably 4 to 40% by weight, still more preferably 5 to 30% by weight, particularly preferably 6 to 20% by weight based on the core particles.

When the core particles are inorganic particles such as glass beads or polymer particles on the other hand, a coating rate of the conductive metal on the surfaces of the core particles is preferably at least 70%, more preferably at least 90%.

The particle diameter of the conductive particles is preferably 1 to 1,000 $\mu$m, more preferably 2 to 500 $\mu$m, still more preferably 5 to 300 $\mu$m, particularly preferably 10 to 200 $\mu$m.

The particle diameter distribution (Dw/Dn) of the conductive particles is preferably 1 to 10, more preferably 1.01 to 7, still more preferably 1.05 to 5, particularly preferably 1.1 to 4.

When conductive particle satisfying such conditions are used, the resulting conductive parts 11 become easy to deform under pressure, and sufficient electrical contact is achieved among the conductive particles.

No particular limitation is imposed on the form of the conductive particles. However, they are preferably in the form of a sphere or star, or a mass of secondary particles obtained by aggregating these particles from the viewpoint of permitting easy dispersion of these particles in the polymeric substance-forming material.

The water content in the conductive particles is preferably at most 5%, more preferably at most 3%, still more preferably at most 2%, particularly preferably at most 1%. The use of the conductive particles satisfying such conditions can prevent or inhibit the occurrence of bubbles upon the curing treatment of the polymeric substance-forming material.

As the conductive particles, may be suitably used those the surfaces of which is treated with a coupling agent such as a silane coupling agent. By treating the surfaces of the conductive particles with the coupling agent, the adhesion property of the conductive particles to the elastic polymeric substance is enhanced, so that the resulting conductive parts 11 become high in durability upon repeated use.

The amount of the coupling agent used is suitably selected within limits not affecting the conductivity of the conductive particles. However, it is preferably such an amount that a coating rate (proportion of coated area of the coupling agent to the whole surface area of the conductive core particles) of the coupling agent on the surfaces of the conductive particles amounts to at least 5%, more preferably 7 to 100%, still more preferably 10 to 100%, particularly preferably 20 to 100%.

The conductive particles are preferably contained in the conductive parts 11 in a proportion of 10 to 60%, more preferably 20 to 40% in terms of volume fraction. If this proportion is lower than 10%, the conductive parts 11 cannot be provided as those sufficiently low in electric resistance value. If the proportion exceeds 60% on the other hand, the resulting conductive parts 11 tend to become brittle, so that elasticity required of the conductive parts may not be achieved in some cases.

The electric resistance of the conductive parts 11 in the thickness-wise direction thereof is preferably at most 100 m$\Omega$ in a state that the conductive parts 11 have been pressurized in the thickness-wise direction.

The semiconductive parts 12 exhibit semiconductivity in the plane direction of the sheet and are formed by a base material composed of a polymeric substance containing a semiconductivity-imparting substance, or a polymeric substance exhibiting semiconductivity.

The term "semiconductivity" as used herein means that exhibiting a volume resistivity value of $10^{-7}$ to $10^4$ $\Omega$m or exhibiting a surface resistivity value of $10^{-1}$ to $10^{10}$ $\Omega/\square$ from the viewpoint of the even balance with the thickness of the anisotropically conductive sheet.

As the polymeric substance forming the base material of the semiconductive parts 12, may be used those exemplified as the elastic polymeric substance forming the base material of the conductive parts 11. Besides, various kinds of thermoplastic resins and curable resins capable of being cured by radiation, heat, ion, acid or the like may also be used.

As the semiconductivity-imparting substance contained in the base material of the semiconductive parts 12, may be used a substance exhibiting conductivity or semiconductivity by itself (hereinafter also referred to as "selfconductive substance"), a substance developing conductivity or semiconductivity by moisture absorption (hereinafter also referred to as "hygroscopic conductive substance") or the like.

The selfconductive substance can be selected for use from among substances exhibiting conductivity by metallic bond, substances in which charge transfer occurs by transfer of excess electrons, substances in which charge transfer occurs by transfer of holes, substances in which an ion is formed and an electric charge is transferred by the ion, substances which have π bonds along a main chain and exhibit conductivity by interaction thereof, substances which cause charge transfer by interaction of groups present on side chains, etc. Specific examples of selfconductive substances usable include particles of metals including platinum, gold, silver, copper, nickel, cobalt, iron, aluminum, manganese, zinc, tin, lead, indium, molybdenum, niobium, tantalum, chromium, etc.; conductive metal oxides such as copper dioxide, zinc oxide and tin oxide and the like; semiconductive substances such as germanium, silicon, indium phosphide and zinc sulfide; carbonaceous substances such as carbon black and graphite; substances forming a cation, such as quaternary ammonium salts and amine compounds; substances forming an anion, such as aliphatic sulfonates, salts of higher alcohol sulfates, salts of ethylene oxide-added higher alcohol sulfates, salts of higher alcohol phosphates and salts of ethylene oxide-added higher alcohol phosphates; substances forming both cation and anion, such as betaine; and conductive polymeric substances such as polyacetylene type polymers, acrylic polymers, polyphenylene type polymers, heterocyclic polymers, ladder polymers, network polymers and ionic polymers. In the above-described substances, the substances forming an ion may be named generically surfactants. In the polymers such as the polyacetylene type polymers, acrylic polymers, polyphenylene type polymers, ladder polymers and network polymers, their conductivity may be controlled by doping them with a metal ion or the like.

In general, the hygroscopic conductive substances are preferably substances of high hygroscopicity and having a hydroxyl group, ester group or the like that is high in polarity. Specific examples of hygroscopic conductive substances usable include silicon compounds such as polychlorosiloxanes, alkoxysilanes, polyalkoxysilanes and polyalkoxysiloxanes; polymeric substances such as conductive urethane, polyvinyl alcohol and copolymers thereof; alcoholic surfactants such as higher alcohol ethylene oxides, polyethylene glycol fatty acid esters and polyhydric alcohol fatty acid esters; and polysaccharides.

Among these, the conductive polymeric substances may be used as base materials for forming the semiconductive parts 12.

Among the above conductive substances, the aliphatic sulfonates may be mentioned as preferred substances. Of the aliphatic sulfonates, a metal salt of an alkylsulfonic acid is particularly preferably used. In this case, moderate conductivity is imparted to achieve a desired antistatic effect, and moreover a stable antistatic effect is exhibited even when the resulting anisotropically conductive sheet is used repeatedly in a treatment at a high temperature, for example, burn-in inspection, since the metal salt of the alkylsulfonic acid has excellent heat stability.

As the metal salt of the alkylsulfonic acid, is preferred an alkali metal salt. Specific examples thereof include sodium 1-decanesulfonate, sodium 1-undecane-sulfonate, sodium 1-dodecanesulfonate, sodium 1-tridecane-sulfonate, sodium 1-tetradecanesulfonate, sodium 1-pentadecanesulfonate, sodium 1-hexadecanesulfonate, sodium 1-heptadecanesulfonate, sodium 1-octadecanesulfonate, sodium 1-nonadecanesulfonate, sodium 1-eicosanedecasulfonate, potassium 1-decanesulfonate, potassium 1-undecanesulfonate, potassium 1-dodecanesulfonate, potassium 1-tridecanesulfonate, potassium 1-tetradecanesulfonate, potassium 1-pentadecanesulfonate, potassium 1-hexadecanesulfonate, potassium 1-heptadecanesulfonate, potassium 1-octadecanesulfonate, potassium 1-nonadecanesulfonate, potassium 1-eicosanedecasulfonate, lithium 1-decanesulfonate, lithium 1-undecanesulfonate, lithium 1-dodecanesulfonate, lithium 1-tridecanesulfonate, lithium 1-tetradecanesulfonate, lithium 1-pentadecanesulfonate, lithium 1-hexadecanesulfonate, lithium 1-heptadecanesulfonate, lithium 1-octadecanesulfonate, lithium 1-nonadecanesulfonate, lithium 1-eicosanedecasulfonate and isomers thereof.

Among these compounds, the sodium salts are particularly preferred in that they are excellent in heat resistance. These salts may be used in combination. The amount of the metal salt of the alkylsulfonic acid added is preferably within a range of 0.1 to 20% by mass based on the polymeric substance forming the base material of the semiconductive parts. The reason for it is that if the content of the metal salt of the alkylsulfonic acid is lower than 0.1% by mass, the antistatic effect achieved may become low in some cases, and if the content exceeds 20% by mass on the other hand, the mechanical strength of the base material of the resulting semiconductive parts may be lowered, or the electric conductivity of the insulating part between adjacent conductive parts may become high to make insulating property between both conductive parts insufficient in some cases.

The electric conductivity of the semiconductive parts is preferably $10^{-14}$ S/cm to $10^{-7}$ S/cm. When the electric conductivity is not lower than $10^{-14}$ S/cm, sufficient antistatic performance against static electricity can be attained. When the electric conductivity is not higher than $10^{-7}$ S/cm, sufficient insulating property is attained between adjacent conductive parts. It is hence preferable to control the electric conductivity within the above range.

A composition for forming an anisotropically conductive sheet can be prepared by, for example, mixing Solution A and Solution B of addition type liquid silicone rubber "KE1950-40" (product of Shin-Etsu Chemical Co., Ltd.) in proportions that their amounts become equal in terms of weight, adding to 100 parts by mass of the mixture, 130 parts by mass of conductive particles having an average particle diameter of 40 μm, which have been prepared by using nickel particles ("SF300", product of Shellit Co.) as core particles and subjecting the particles to electroless plating with gold so as to give an average coating amount of 6% by mass based on the core particles, and 2.5 parts by mass of sodium alkylsulfonate ($C_nH_{2n+1}SO_3Na$ (n=12 to 20)) to mix them, and then subjecting the resultant mixture to a deaerating treatment under reduced pressure.

With respect to the addition type liquid silicone rubber "KE1950-40", the viscosities (as determined by a Brookfield type viscometer) of Solution A and Solution B at 23° C. are both 4,800 P, the compression set (JIS K 6249) at 150° C. of the cured product thereof is 20%, the durometer hardness A (JIS K 6249) at 23° C. is 42, and the tensile strength (JIS K 6249, crescent type) is 35.6 kgf/cm.

Since the anisotropically conductive sheet 10 in the embodiment illustrated is in a state that adjacent conductive parts 11 have been connected to each other through the semiconductive part 12, the surface resistivity of the semiconductive part 12 is preferably $10^5$ to $10^{10}$ Ω/□, particularly preferably $10^6$ to $10^8$ Ω/□. If the surface resistivity is lower than $10^5$ Ω/□, the required insulating property between the adjacent conductive parts 11 may not be attained in some cases. If the surface resistivity exceeds $10^{10}$ Ω/□ on the other hand, difficulty may be encountered on the sufficient prevention or inhibition of charging on the surface of the anisotropically conductive sheet 10 in some cases.

For the same reasons, the electric conductivity (inverse number of volume resistivity) of the semiconductive parts 12 is preferably $10^{-3}$ to $10^{-5}\ \Omega^{-1}\text{m}^{-1}$, for example, when the thickness of the anisotropically conductive sheet 10 is 1 mm.

Figure 2:
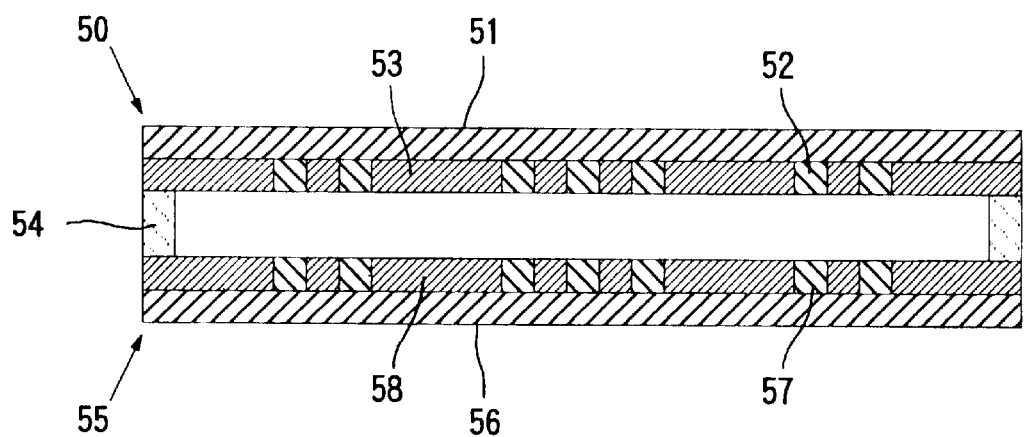
FIG. 2 is a cross-sectional view illustrating the construction of an exemplary mold used for producing an anisotropically conductive sheet according to the first aspect of the present invention.

Such an anisotropically conductive sheet 10 can be produced in accordance with any one of, for example, the following Processes (a) to (c):

Process (a):

In Process (a), such a mold as illustrated in FIG. 2 is used. This mold is so constructed that a top force 50 and a bottom force 55 making a pair therewith are arranged so as to be opposed to each other through a frame-like spacer 54.

In the top force 50, ferromagnetic portions 52 are formed according to a pattern corresponding to the arrangement pattern of the conductive parts 11 of the intended anisotropically conductive sheet 10 on the lower surface of a ferromagnetic base plate 51, and non-magnetic portions 53 are formed at other areas than the ferromagnetic portions 52.

In the bottom force 55 on the other hand, ferromagnetic portions 57 are formed according to a pattern corresponding to the arrangement pattern of the conductive parts 11 of the intended anisotropically conductive sheet 10 on the upper surface of a ferromagnetic base plate 56, and non-magnetic portions 58 are formed at other areas than the ferromagnetic portions 57.

As a material for forming the ferromagnetic base plates 51, 56 and ferromagnetic portions 52, 57 in both top force 50 and bottom force 55, may be used iron, nickel, cobalt or an alloy thereof, or the like.

As a material for forming the non-magnetic portions 53, 58 in both top force 50 and bottom force 55, may be used a non-magnetic metal such as copper, a heat-resistant resin such as polyimide, or the like.

In Process (a), the anisotropically conductive sheet 10 is produced in the following manner using the above-described mold.

Figure 3:
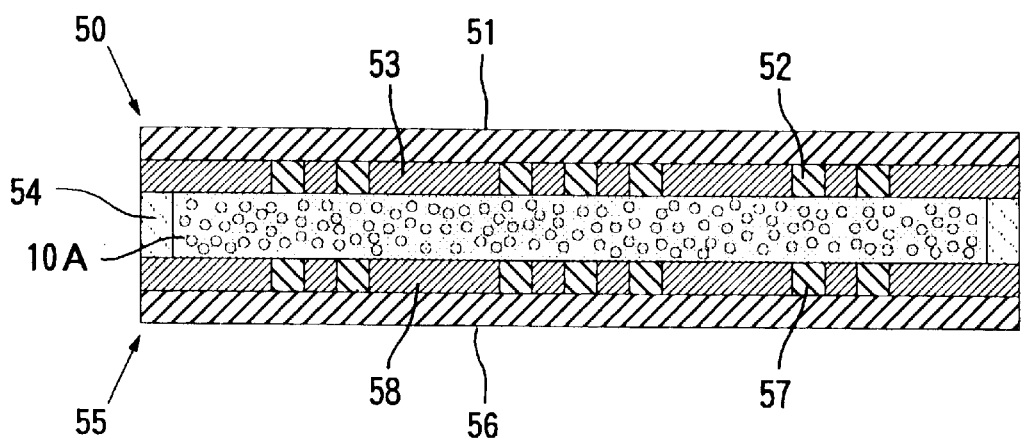
FIG. 3 is a cross-sectional view illustrating a state that a sheet-forming material layer has been formed in the mold shown in FIG. 2.

A flowable sheet-forming material with conductive particles which exhibit magnetism, and a semiconductivity-imparting substance dispersed in a polymeric substance-forming material which will become an elastic polymeric substance by curing is first prepared, and the sheet-forming material is filled into the mold as illustrated in FIG. 3, thereby forming a sheet-forming material layer 10A.

Figure 4:
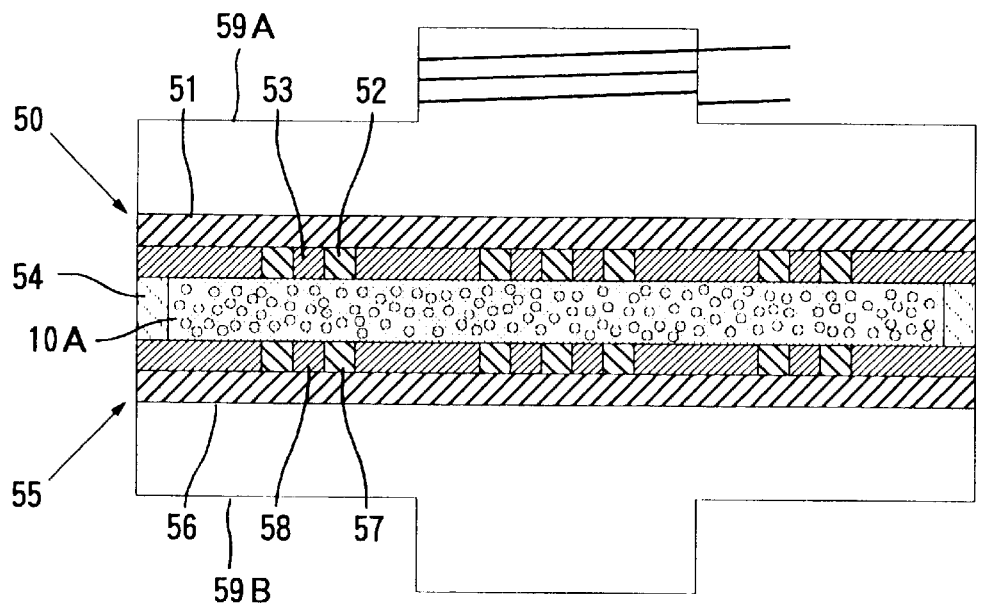
FIG. 4 is a cross-sectional view illustrating a state that a magnetic field has been applied to the sheet-forming material layer.

A pair of electromagnets 59A, 59B are then arranged on the upper surface of the ferromagnetic base plate 51 in the top force 50 and the lower surface of the. ferromagnetic base plate 56 in the bottom force 55 as illustrated in FIG. 4, and the electromagnets 59A, 59B are energized, thereby applying a parallel magnetic field having an intensity distribution, i.e., a parallel magnetic field having high intensity between the ferromagnetic portions 52 in the top force 50 and their corresponding ferromagnetic portions 57 in the bottom force 55, to the sheet-forming material layer 10A in the thickness-wise direction thereof. As a result, in the sheet-forming material layer 10A, the conductive particles dispersed in the sheet-forming material layer 10A are gathered at portions located between the ferromagnetic portions 52 in the top force 50 and their corresponding ferromagnetic portions 57 in the bottom force 55 and at the same time oriented so as to be arranged in the thickness-wise direction of the sheet-forming material layer 10A.

Figure 5:
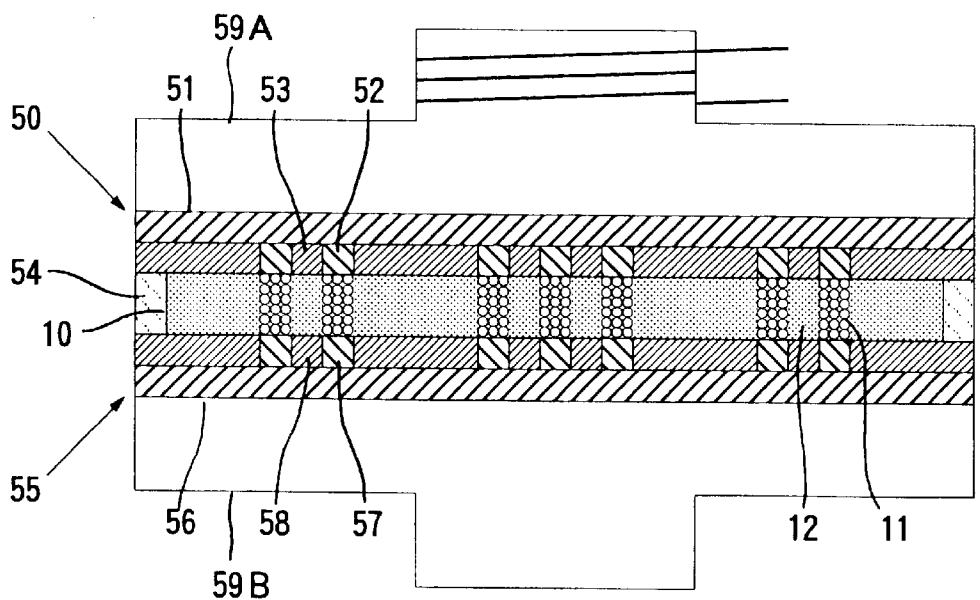
FIG. 5 is a cross-sectional view illustrating a state that the sheet-forming material layer has been subjected to a curing treatment to form conductive parts and semiconductive parts.

In this state, the sheet-forming material layer 10A is subjected to a curing treatment, thereby producing an anisotropically conductive sheet 10 comprising, as illustrated in FIG. 5, conductive parts 11 arranged between the ferromagnetic portions 52 in the top force 50 and their corresponding ferromagnetic portions 57 in the bottom force 55, in which the conductive particles are closely filled in the elastic polymeric substance, and semiconductive parts 12 in which the semiconductivity-imparting substance is contained in the elastic polymeric substance, and the conductive particles are not present at all or scarcely present.

In the above-described process, the curing treatment of the sheet-forming material layer 10A may be conducted in the state that the parallel magnetic field is being applied. However, the treatment may also be conducted after stopping the application of the parallel magnetic field.

The intensity of the parallel magnetic field applied to the sheet-forming material layer 10A is an intensity that it amounts to 200 to 10,000 G on the average.

As a means for applying the parallel magnetic field, permanent magnets may also be used in place of the electromagnets. As such a permanent magnet, are preferred those composed of alunico (Fe—Al—Ni—Co alloy), ferrite or the like in that the intensity of parallel magnetic field within the above range is achieved.

The curing treatment of the sheet-forming material layer 10A is suitably selected according to the material used. However, the treatment is generally conducted by a heat treatment. Specific heating temperature and heating time are suitably selected in view of the kinds of the polymeric substance-forming material and the like making up the sheet-forming material layer 10A, the time required for transfer of the conductive particles, and the like.

Figure 6:
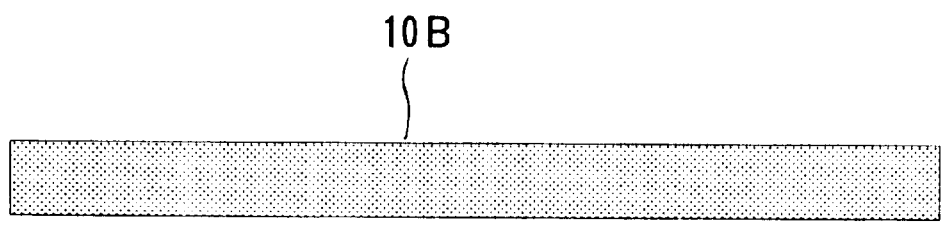
FIG. 6 is a cross-sectional view illustrating a sheet for semiconductive part.
Figure 7:
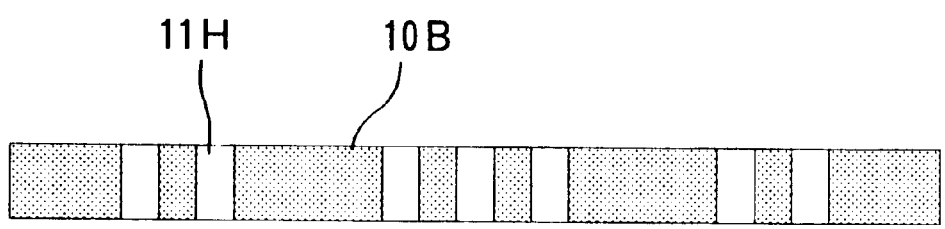
FIG. 7 is a cross-sectional view illustrating a state that through-holes have been made in the sheet for semiconductive part.

Process (b):

In Process (b), a sheet 10B for semiconductive part formed of, for example, an elastic polymeric substance, thermoplastic resin or curable resin containing a semiconductivity-imparting substance, or a polymeric substance exhibiting semiconductivity is provided as illustrated in FIG. 6. A plurality of through-holes 11H are made in the sheet 10B for semiconductive part according to a pattern corresponding to the pattern of conductive parts 11 to be formed as illustrated in FIG. 7.

As a means for making the through-holes 11H in the sheet 10B for semiconductive part, may be used a means by laser processing, a means by punching making use of a punch, a means by drilling, or the like.

Figure 8:
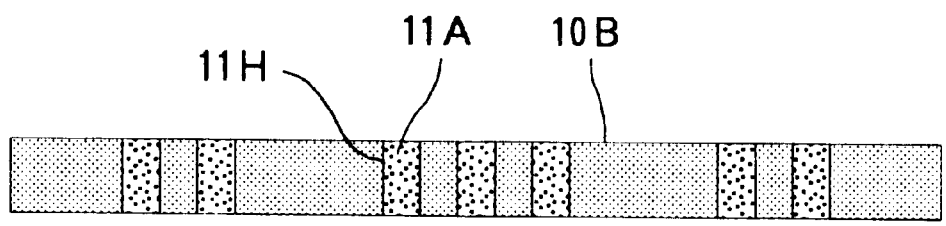
FIG. 8 is a cross-sectional view illustrating a state that a material layer for conductive part has been formed in each of the through-holes in the sheet for semiconductive part.

On the other hand, a flowable material for conductive part, in which conductive particles exhibiting magnetism are dispersed in a polymer-forming material, is prepared. The material for conductive part is filled into the through-holes 11H in the sheet 10B for semiconductive part, thereby forming layers 11A of the material for conductive part in the through-holes 11H as illustrated in FIG. 8.

Thereafter, a parallel magnetic field is applied to the layers 11A of the material for conductive part in the thickness-wise direction thereof by electromagnets or permanent magnets, thereby orienting the conductive particles dispersed in the layers 11A of the material for conductive part so as to be arranged in the thickness-wise direction.

In this state, the layers 11A of the material for conductive part are subjected to a curing treatment, thereby forming conductive parts 11, in which the conductive particles are contained in a state oriented so as to be arranged in the thickness-wise direction, to produce an anisotropically conductive sheet 10 having the structure illustrated in FIG. 1.

Figure 9:
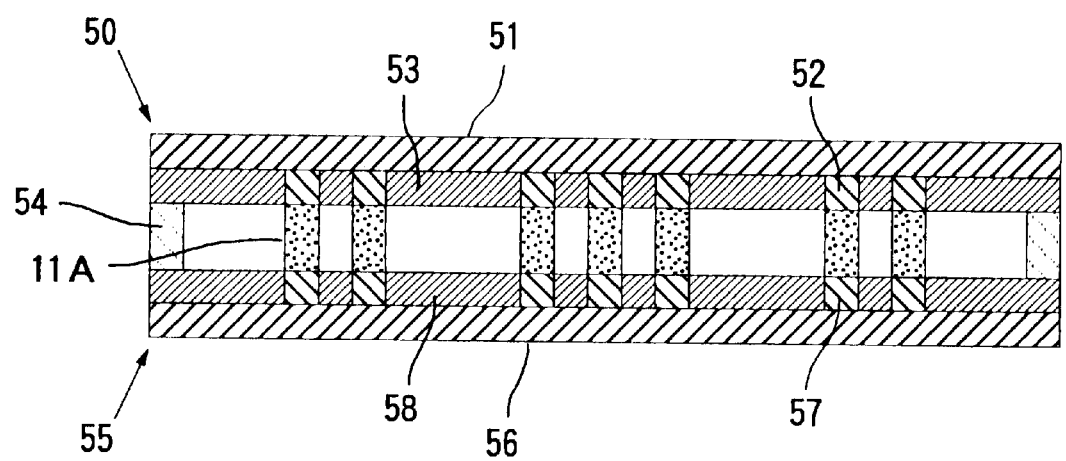
FIG. 9 is a cross-sectional view illustrating a state that material layers for conductive part have been formed in a mold.

Process (c):

In Process (c), for example, such a mold as illustrated in FIG. 2 is first provided to form layers 11A of a material for conductive part, in which conductive particles exhibiting magnetism are dispersed in a polymer-forming material, between the ferromagnetic portions 52 in the top force 50 and the ferromagnetic portions 57 in the bottom force 55 as illustrated in FIG. 9. In order to form such layers 11A of the material for conductive part, it is only necessary to apply the material for conductive part to the surfaces of any ones of the ferromagnetic portions 52 in the top force 50 and the ferromagnetic portions 57 in the bottom force 55, or the surfaces of both and then to overlay the top force 50 and the bottom force 55 on top of another. As a means for applying the material for conductive part, may be used a printing method such as screen printing.

Figure 10:
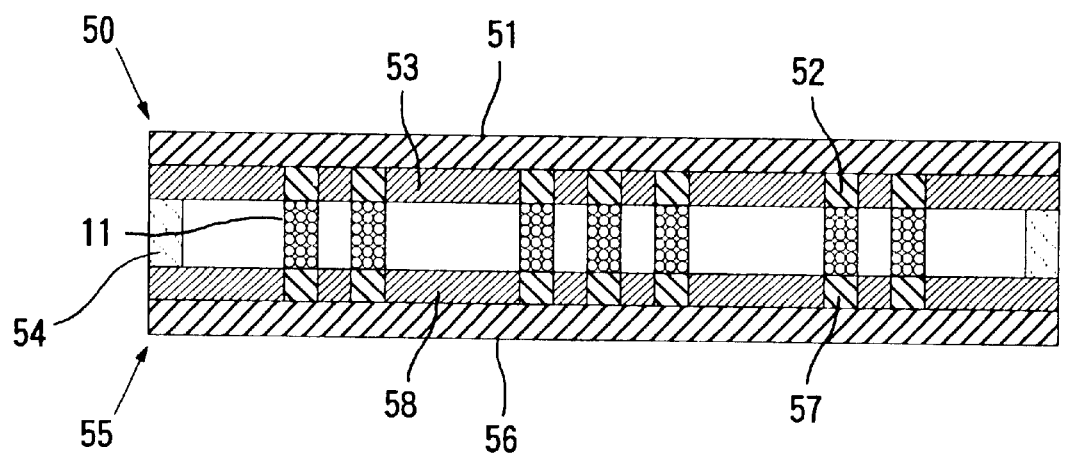
FIG. 10 is a cross-sectional view illustrating a state that conductive parts have been formed in the mold.

A parallel magnetic field is then applied to the layers 11A of the material for conductive part formed in the mold in the thickness-wise direction thereof by electromagnets or permanent magnets, thereby orienting the conductive particles dispersed in the layers 11A of the material for conductive part so as to be arranged in the thickness-wise direction. In this state, the layers 11A of the material for conductive part are subjected to a curing treatment, thereby forming conductive parts 11, in which the conductive particles are contained in the elastic polymeric substance in a state oriented so as to be arranged in the thickness-wise direction, between the ferromagnetic portions 52 in the top force 50 and the ferromagnetic portions 57 in the bottom force 55 as illustrated in FIG. 10.

Figure 11:
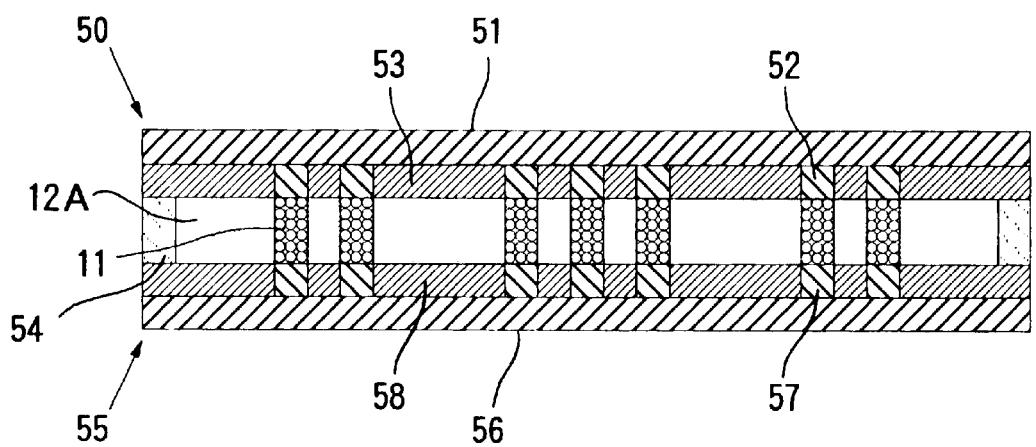
FIG. 11 is a cross-sectional view illustrating a state that a material layer for semiconductive part have been formed so that the respective conductive parts are surrounded.

A material for semiconductive part, in which a semiconductivity-imparting substance is contained in a polymeric substance-forming material which will become an elastic polymeric substance by curing, or a curable resin material, is filled into the mold, thereby forming layers 12A of the material for semiconductive part between the nonmagnetic portions 53 in the top force 50 and the nonmagnetic portions 58 in the bottom force 55 so as to surround the respective conductive parts 11 as illustrated in FIG. 11. Thereafter, the layers 12A of the material for semiconductive part are subjected to a curing treatment, thereby forming semiconductive parts 12, in which the semiconductivity-imparting substance is contained in the elastic polymeric substance or the cured resin, to produce an anisotropically conductive sheet 10 having the structure illustrated in FIG. 1.

According to the anisotropically conductive sheet 10 described above, since the semiconductive parts 12 which exhibit semiconductivity in the plane direction of the sheet, are formed so as to surround the respective conductive parts 11, the elimination of static charge is conducted through the semiconductive parts 12 by grounding the semiconductive parts 12, so that the anisotropically conductive sheet can be prevented or inhibited from being charged by generation of static electricity on the surface thereof.

Second Embodiment

Figure 12:
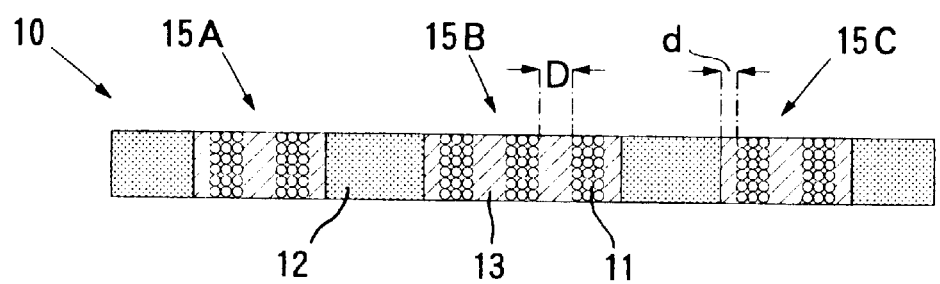
FIG. 12 is a cross-sectional view illustrating the construction of an anisotropically conductive sheet according to the second embodiment in the first aspect of the present invention.

FIG. 12 is a cross-sectional view illustrating the construction of an anisotropically conductive sheet according to the second embodiment in the first aspect of the present invention. In the anisotropically conductive sheet 10, high-density conductive part regions 15A, 15B, 15C, in each of which a plurality of columnar conductive parts 11 each extending in the thickness-wise direction of the sheet are arranged at a small pitch and a high density, are formed. In each of the high-density conductive part regions 15A, 15B, 15C, insulating part or parts 13 are formed so as to surround the respective conductive parts 11. Semiconductive part or parts 12 are formed so as to surround the respective insulating parts 13.

As a material for forming the insulating parts 13, may be used those exemplified as the elastic polymeric substance forming the base material of the conductive parts 11. Besides, various kinds of thermoplastic resins and curable resins capable of being cured by radiation, heat, ion, acid or the like may also be used.

The constructions of the conductive parts 11 and the semiconductive parts 12 are the same as in the first embodiment.

In such an anisotropically conductive sheet 10, a clearance d between the semiconductive part 12 and the conductive part 11 closest thereto is preferably at most 5 mm, particularly preferably 0.1 to 2 mm. If this clearance d exceeds 10 mm, a wide-area region is formed between the conductive part 11 and the semiconductive part 12, so that static electricity is easy to generate in this region to be charged. If the clearance is too small on the other hand, the required insulating property in the plane direction may not be attained in some cases according to the material of the semiconductive parts 12.

For the same reasons, a clearance D between adjacent conductive parts 11 in each of the high-density conductive part regions 15A, 15B, 15C is preferably at most 3 mm, particularly preferably 0.1 to 1 mm.

Figure 13:
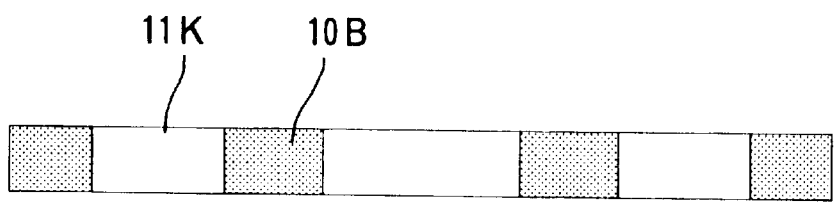
FIG. 13 is a cross-sectional view illustrating a state that openings have been made in a sheet for semiconductive part.

Such an anisotropically conductive sheet 10 can be produced in accordance with, for example, the following Process (d) or (e):

Process (d):

In Process (d), a sheet 10B for semiconductive part formed of an elastic polymeric substance, thermoplastic resin or curable resin containing a semiconductivity-imparting substance, or a polymeric substance exhibiting semiconductivity is provided as illustrated in FIG. 6. A plurality of openings 11K is made in the sheet 10B for semiconductive part according to a pattern corresponding to the high-density conductive part regions 15A, 15B, 15C to be formed as illustrated in FIG. 13.

Figure 14:
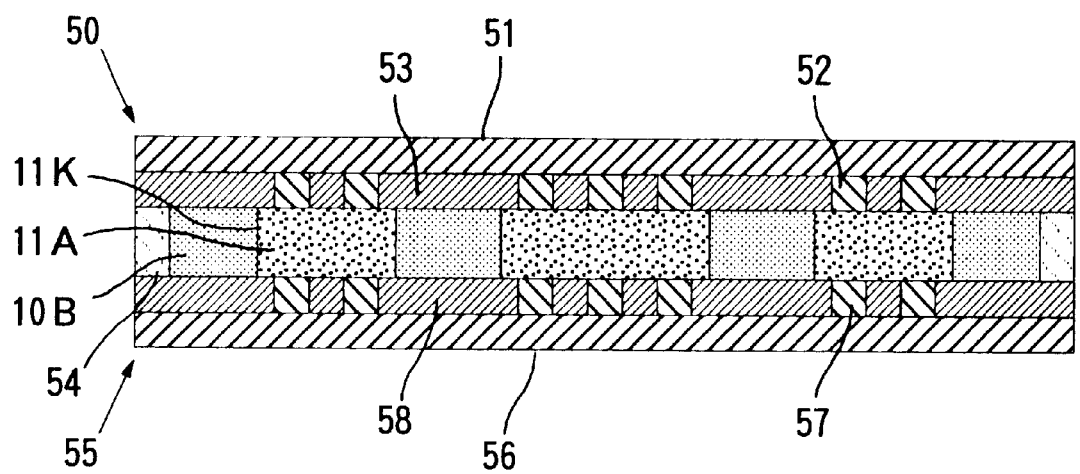
FIG. 14 is a cross-sectional view illustrating a state that a material layer for conductive part has been formed in each of the through-holes in the sheet for semiconductive part, and the sheet for semiconductive part has been arranged in a mold.

As a means for making the openings 11K in the sheet 10B for semiconductive part, may be used the same means as the means for making the through-holes 11H in the sheet 10B for semiconductive part in the above-described Process A flowable material for conductive part, in which conductive particles exhibiting magnetism are dispersed in a polymer-forming material, is then filled into the openings 11K in the sheet 10B for semiconductive part, thereby forming layers 11A of the material for conductive part in the openings 11K and the sheet 10B for semiconductive part, in which the layers 11A of the material for conductive part have been formed, is arranged in the mold shown in FIG. 2, as illustrated in FIG. 14.

Thereafter, a parallel magnetic field having an intensity distribution, i.e., a parallel magnetic field having high intensity between the ferromagnetic portions 52 in the top force 50 and their corresponding ferromagnetic portions 57 in the bottom force 55, is applied to the layers 11A of the material for conductive part in the thickness-wise direction thereof by electromagnets or permanent magnets, whereby the conductive particles dispersed in the layers 11A of the material for conductive part are gathered at portions located between the ferromagnetic portions 52 in the top force 50 and their corresponding ferromagnetic portions 57 in the bottom force 55 and at the same time oriented so as to be arranged in the thickness-wise direction.

In this state, the layers 11A of the material for conductive part are subjected to a curing treatment, thereby forming conductive parts 11 arranged between the ferromagnetic portions 52 in the top force 50 and their corresponding ferromagnetic portions 57 in the bottom force 55, in which the conductive particles are closely filled in the elastic polymeric substance, and at the same time forming insulating parts 13 composed of the elastic polymeric substance, in which the conductive particles are not present at all or scarcely present, so as to surround the respective conductive parts 11 to produce an anisotropically conductive sheet 10 illustrated in FIG. 12.

Figure 15:
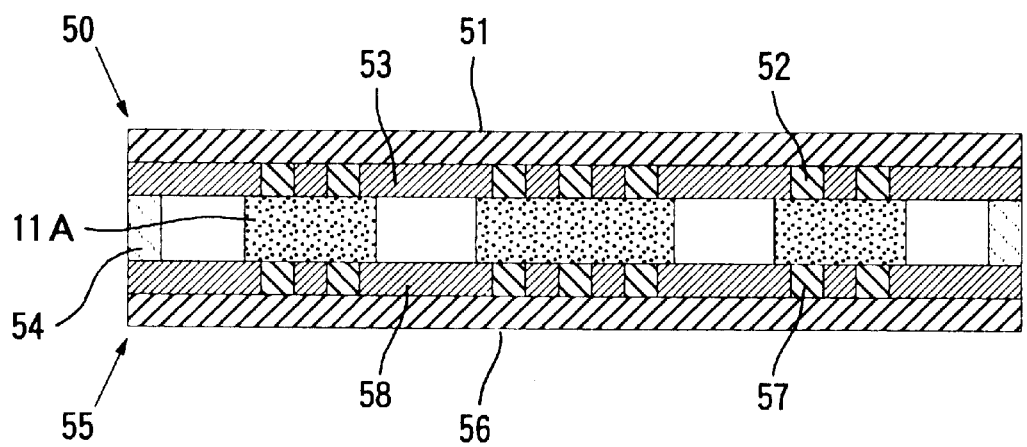
FIG. 15 is a cross-sectional view illustrating a state that material layers for conductive part have been formed in the mold.
Figure 16:
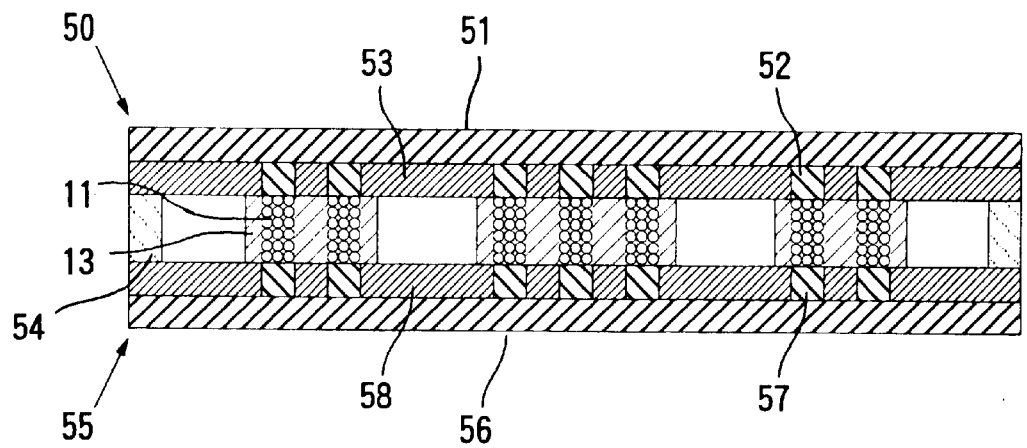
FIG. 16 is a cross-sectional view illustrating a state that conductive parts and insulating parts surrounding the respective conductive parts have been formed in the mold.

Process (e):

In Process (e), for example, such a mold as illustrated in FIG. 2 is first provided to form layers 11A of a material for conductive part, in which conductive particles exhibiting magnetism are dispersed in a polymer-forming material, in regions corresponding to the high-density conductive part regions 15A, 15B, 15C to be formed between the top force 50 and the bottom force 55 as illustrated in FIG. 15. In order to form such layers 11A of the material for conductive part, it is only necessary to apply a flowable material for conductive part to the regions corresponding to the high-density conductive part regions 15A, 15B, 15C to be formed on the surface of any one of the top force 50 and the bottom force 55, or the surfaces of both and then to overlay the top force 50 and the bottom force 55 on top of another. As a means for applying the material for conductive part, may be used a printing method such as screen printing.

A parallel magnetic field having an intensity distribution, i.e., a parallel magnetic field having high intensity between the ferromagnetic portions 52 in the top force 50 and their corresponding ferromagnetic portions 57 in the bottom force 55, is applied to the layers 11A of the material for conductive part formed in the mold in the thickness-wise direction thereof by electromagnets or permanent magnets, whereby the conductive particles dispersed in the layers 11A of the material for conductive part are gathered at portions located between the ferromagnetic portions 52 in the top force 50 and their corresponding ferromagnetic portions 57 in the bottom force 55 and at the same time oriented so as to be arranged in the thickness-wise direction.

In this state, the layers 11A of the material for conductive part are subjected to a curing treatment, thereby forming conductive parts 11 arranged between the ferromagnetic portions 52 in the top force 50 and their corresponding ferromagnetic portions 57 in the bottom force 55, in which the conductive particles are closely filled in the elastic polymeric substance, and at the same time forming insulating parts 13 composed of the elastic polymeric substance, in which the conductive particles are not present at all or scarcely present.

Figure 17:
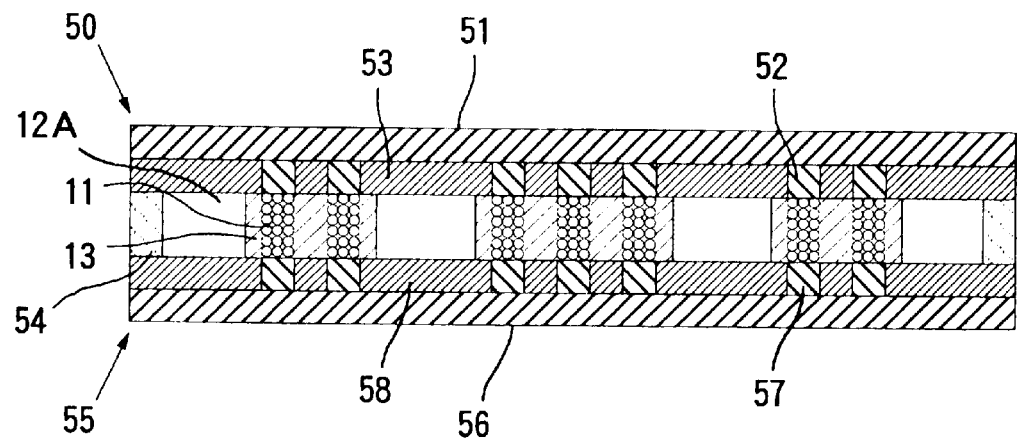
FIG. 17 is a cross-sectional view illustrating a state that m ate rial layers for semiconductive part have been formed so as to surround the respective insulating parts in the mold.

A flowable material for semiconductive part, in which a semiconductivity-imparting substance is contained in a polymeric substance-forming material which will become an elastic polymeric substance by curing, or a curable resin material, is then filled into the mold, thereby forming layers 12A of the material for semiconductive part so as to surround the respective insulating parts 13 as illustrated in FIG. 17. The layers 12A of the material for semiconductive part are subjected to a curing treatment, thereby forming semiconductive parts 12, in which the semiconductivity-imparting substance is contained in the elastic polymeric substance or the cured resin, to produce an anisotropically conductive sheet 10 illustrated in FIG. 12.

According to the anisotropically conductive sheet 10 described above, the same effects as the anisotropically conductive sheet 10 according to the first embodiment described above are achieved. At the same time, the insulating parts 13 are formed so as to surround the respective conductive parts 11, so that the required insulating property between the adjacent conductive parts 11 can be surely achieved.

Third Embodiment

Figure 18:
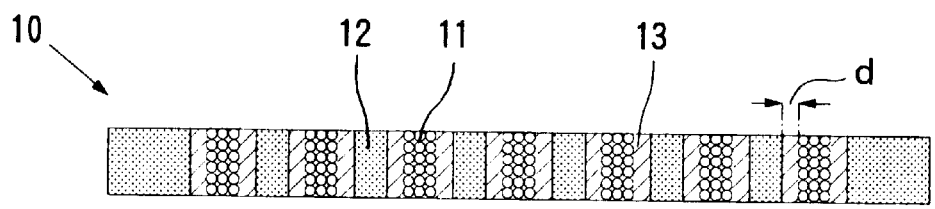
FIG. 18 is a cross-sectional view illustrating the construction of an anisotropically conductive sheet according to the third embodiment in the first aspect of the present invention.

FIG. 18 is a cross-sectional view illustrating the construction of an anisotropically conductive sheet according to the third embodiment in the first aspect of the present invention.

In the anisotropically conductive sheet 10, a plurality of columnar conductive parts 11 each extending in the thickness-wise direction of the sheet are arranged along the plane direction thereof according to a pattern corresponding to a pattern of electrodes to be connected, cylindrical insulating parts 13 are formed so as to surround the respective conductive parts 11, and semiconductive part or parts 12 are formed so as to surround the respective insulating parts 13.

In this embodiment, a clearance d between the semiconductive part 12 and the conductive part 11 closest thereto is the same as in the second embodiment described above.

Such an anisotropically conductive sheet 10 can be produced in accordance with Process (d) or (e) in the second embodiment described above.

According to the anisotropically conductive sheet 10 according to the third embodiment, the same effects as the anisotropically conductive sheet 10 according to the second embodiment described above are achieved.

Fourth Embodiment

Figure 19:
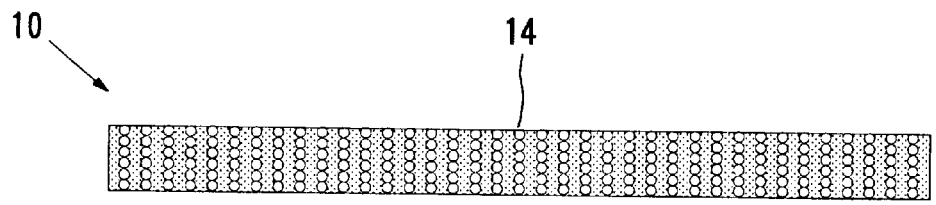
FIG. 19 is a cross-sectional view illustrating the construction of an anisotropically conductive sheet according to the fourth embodiment in the first aspect of the present invention.

FIG. 19 is a cross-sectional view illustrating the construction of an anisotropically conductive sheet according to the fourth embodiment in the first aspect of the present invention. In this anisotropically conductive sheet 10, conductive particles are contained in a base sheet 14 exhibiting semiconductivity in its plane direction in a state oriented so as to be arranged in the thickness-wise direction of the base sheet 14 over the whole area thereof. The base sheet 14 is constructed by containing a semiconductivity-imparting substance in an elastic polymeric substance. The anisotropically conductive sheet 10 is such that conductive paths are formed by the conductive particles at any portions, at which the surface of the sheet is pressurized in the thickness-wise direction.

In such an anisotropically conductive sheet 10, the conductive particles are preferably contained in the base sheet 14 in a proportion of 3 to 30%, particularly preferably 5 to 15% in terms of volume fraction. If this proportion is lower than 3%, it may be difficult in some cases to form conductive paths sufficiently low in electric resistance. If the proportion exceeds 50% on the other hand, in some cases, the resulting anisotropically conductive sheet 10 may become brittle, or it may exhibit conductivity even in the plane direction not to exhibit the required anisotropic conductivity.

In this anisotropically conductive sheet 10, the surface resistivity of the base sheet is preferably $10^6$ to $10^{10}$ $\Omega/\square$, particularly preferably $10^7$ to $10^9$ $\Omega/\square$. If the surface resistivity is lower than $10^6$ $\Omega/\square$, the required insulating property between the adjacent conductive paths formed by, for example, pressurizing the surface of the base sheet 14 may not be achieved in some cases. If the surface resistivity exceeds $10^{10}$ $\Omega/\square$ on the other hand, difficulty may be encountered on the sufficient prevention or inhibition of charging on the surface of the anisotropically conductive sheet 10 in some cases.

For the same reasons, the electric conductivity (inverse number of volume resistivity) of the base sheet 14 is preferably $10^{-4}$ to $10^{-6}$ $\Omega^{-1}m^{-1}$.

Such an anisotropically conductive sheet 10 can be produced in accordance with, for example, the following process.

A flowable sheet-forming material with conductive particles which exhibit magnetism, and a semiconductivity-imparting substance dispersed in a polymeric substance-forming material which will become an elastic polymeric substance by curing is first prepared, and the sheet-forming material is applied to the surface of a magnetic plate composed of a ferromagnetic material, thereby forming a sheet-forming material layer. In this embodiment, as the semiconductivity-imparting substance, is used a non-magnetic substance.

A parallel magnetic field is applied to the thus-formed sheet-forming material layer in the thickness-wise direction thereof by electromagnets or permanent magnets. As a result, in the sheet-forming material layer, the conductive particles dispersed in the sheet-forming material layer are oriented so as to be arranged in the thickness-wise direction.

In this state, the sheet-forming material layer is subjected to a curing treatment, thereby forming the base sheet 14 to produce an anisotropically conductive sheet 10 having a structure shown in FIG. 19.

According to the anisotropically conductive sheet 10 described above, the base sheet 14 exhibits semiconductivity in its plane direction, so that the whole of the base sheet 14 becomes a semiconductive part. Therefore, the anisotropically conductive sheet can be prevented or inhibited from being charged by generation of static electricity on the surface thereof by grounding the base sheet 14.

<<Usage of Anisotropically Conductive Sheet>>

The anisotropically conductive sheets in the first aspect of the present invention may be suitably used in electrical inspection of circuit devices. The case where the anisotropically conductive sheet 10 according to the first embodiment described above is used to conduct electrical inspection will hereinafter be described.

Figure 20:
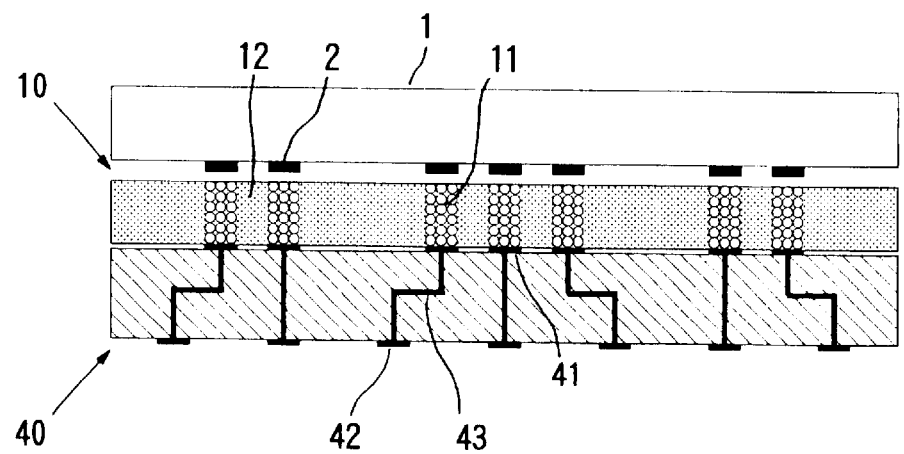
FIG. 20 is a cross-sectional view illustrating a state that the anisotropically conductive sheet according to the first embodiment has been interposed between a circuit device which is an inspection subject, and a connector plate.

In the electrical inspection of a circuit device, as illustrated in FIG. 20, is provided a connector plate 40 which has electrodes 41 for connection arranged according to a pattern corresponding to electrodes 2 to be inspected in the circuit device (hereinafter also referred to "circuit device to be inspected") 1, which is an inspection subject, on its front surface and has terminal electrodes 42 electrically connected to the electrodes 41 for connection through wiring parts 43 and arranged according to a lattice-point arrangement of, for example, a pitch of 2.54 mm, 1.80 mm or 1.27 mm on its back surface. The anisotropically conductive sheet 10 is arranged on the front surface of the connector plate 40 in such a manner that its conductive parts 11 are located on the electrodes 41 for connection, and the circuit device 1 to be inspected is arranged on the anisotropically conductive sheet 10 in such a manner that its electrodes 2 to be inspected are located on the conductive parts 11 of the anisotropically conductive sheet 10. The semiconductive parts 12 in the anisotropically conductive sheet 10 are grounded by a suitable means.

For example, the connector plate 40 is moved in a direction close to the circuit device 1 to be inspected, whereby the anisotropically conductive sheet 10 becomes a state pressurized by the circuit device 1 to be inspected and the connector plate 40. Active conductive paths extending in the thickness-wise direction of the sheet are formed in the conductive parts 11 of the anisotropically conductive sheet 10 by this applied pressure. As a result, electrical connection between the electrodes 2 to be inspected in the circuit device 1 to be inspected and the electrodes 41 for connection in the connector plate 40 is achieved to conduct required electrical inspection in this state.

After completion of the electrical inspection of the circuit device 1 to be inspected, the circuit device 1 to be inspected is changed to another circuit device to be inspected, and the same operation as described above is repeated on said circuit device to be inspected, thereby conducting the electrical inspection thereof.

The use of the anisotropically conductive sheet 10 according to the first aspect of the present invention can prevent or inhibit the surface of the anisotropically conductive sheet 10 from being charged by generation of static electricity on the surface thereof even when the electrical inspection of a great number of circuit devices is continuously conducted. Therefore, it is unnecessary to stop inspecting operations to conduct static charge-eliminating operation on the anisotropically conductive sheet 10. As a result, the electrical inspection of a great number of circuit devices can be conducted with high time efficiency.

The anisotropically conductive sheets 10 according to the first aspect of the present invention are not limited to the embodiments described above, and various modifications may be added thereto.

Figure 21:
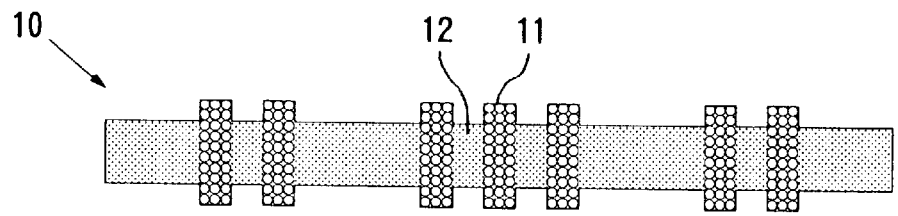
FIG. 21 is a cross-sectional view illustrating the construction of an exemplary, anisotropically conductive sheet according to the first aspect of the present invention, in which conductive parts have been formed in a state projected from the surface of a semiconductive part.

For example, in a feature that anisotropically conductive sheet having a plurality of conductive parts extending in the thickness-wise direction thereof is constructed, the conductive parts 11 may be formed in a state projected from the surface of a semiconductive part 12 as illustrated in FIG. 21.

Figure 22:
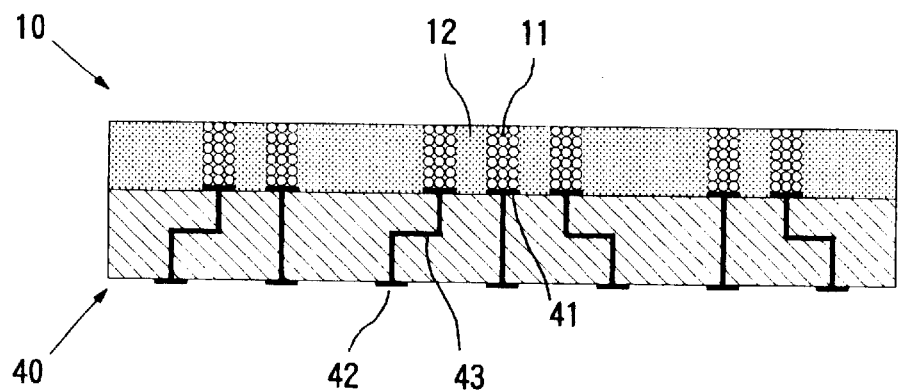
FIG. 22 is a cross-sectional view illustrating the construction of an exemplary, anisotropically conductive sheet according to the first aspect of the present invention, which has been provided integrally on the surface of a connector plate.

As illustrated in FIG. 22, the anisotropically conductive sheet 10 may be provided integrally on, for example, the surface of a connector plate 40 used in the electrical inspection of circuit devices.

Second Aspect of the Invention

<Anisotropically Conductive Sheet>

An anisotropically conductive sheet according to the second aspect of the present invention comprises an anisotropically conductive sheet member having conductivity in its thickness-wise direction and a static charge-eliminating layer provided on at least one surface of the sheet member. The static charge-eliminating layer may be formed over the whole surface of the sheet member or in a partial region of a surface of the sheet member.

<<Sheet Member>>

As the sheet member, may be used those of various structures so far as they are anisotropically conductive sheets having conductivity in the thickness-wise direction. However, a sheet member, in which conductive particles are contained in a base material composed of an elastic polymeric substance in a state oriented so as to be arranged in the thickness-wise direction of the sheet member, may be preferably used.

As the elastic polymeric substance forming the base material of the sheet member, the same elastic polymeric substance as that forming the base material of the conductive parts in the first aspect of the present invention may be used under the same conditions.

As the conductive particles contained in the base material in the sheet member, the same conductive particles as those in the first aspect of the present invention may be used under the same conditions.

In the second aspect of the present invention, as the sheet member, may be used those of various forms. Specifically, a sheet member in which conductive particles are contained over the whole base material composed of the elastic polymeric substance (even distribution type), a sheet member in which a plurality of conductive parts each closely filled with conductive particles and extending in the thickness-wise direction of the sheet member are arranged in a state mutually insulated by insulating parts in which the conductive particles are not present at all or scarcely present (uneven distribution type), a sheet member in which conductive parts are formed in a state projected from a surface or both surfaces of an insulating part, or the like may be used.

Such a sheet member can be produced, for example, in the following manner.

A sheet member-forming material with conductive particles, which exhibit magnetism, dispersed in a polymeric substance-forming material is first prepared, and this sheet member-forming material is filled into a mold for molding a sheet member (hereinafter referred to as "mold" simply).

A parallel magnetic field is then applied to the sheet member-forming material in the mold in the thickness-wise direction thereof, thereby orienting the conductive particles dispersed in the sheet member-forming material so as to be arranged in the thickness-wise direction.

In this state, the sheet member-forming material is subjected to a curing treatment, thereby obtaining a sheet member, in which the conductive particles are contained in a state oriented so as to be arranged in the thickness-wise direction.

In the above-described process, the curing treatment of the sheet member-forming material may be conducted in the state that the parallel magnetic field is being applied. However, the treatment may also be conducted after stopping the application of the parallel magnetic field. The intensity of the parallel magnetic field, means and curing treatment are the same as those in the first aspect of the present invention.

When the intended sheet member is such that a plurality of conductive parts each extending in the thickness-wise direction are arranged in a state mutually insulated by the insulating parts, a parallel magnetic field having an intensity distribution in the plane direction of the sheet member is applied to the sheet member-forming material.

Figure 23:
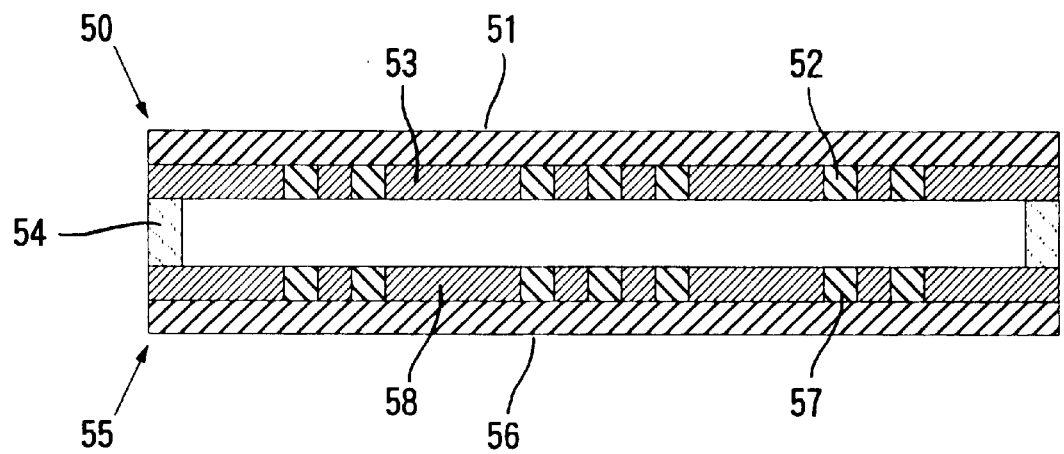
FIG. 23 is a cross-sectional view illustrating the construction of an exemplary mold used for producing a sheet member in an anisotropically conductive sheet according to the second aspect of the present invention.

FIG. 23 is a cross-sectional view illustrating the construction of an exemplary mold used for applying a parallel magnetic field having an intensity distribution to the sheet member-forming material. This mold has the same structure as that illustrated in FIG. 2 and is so constructed that a top force 50 and a bottom force 55 making a pair therewith are arranged so as to be opposed to each other through a frame-like spacer 54. In the top force 50, ferromagnetic portions 52 are formed according to a pattern corresponding to the arrangement pattern of the conductive parts of the intended sheet member. In the bottom force 55 on the other hand, ferromagnetic portions 57 are formed according to a pattern corresponding to the arrangement pattern of the conductive parts of the intended sheet member.

In such a mold, in a state that a sheet member-forming material is filled into the mold, electromagnets or permanent magnets are arranged on the upper surface of a ferromagnetic base plate 51 in the top force 50 and the lower surface of a ferromagnetic base plate 56 in the bottom force 55, whereby a parallel magnetic field acts in a direction from the ferromagnetic portions 52 in the top force 50 toward their corresponding ferromagnetic portions 57 in the bottom force 55. As a result, in the sheet member-forming material, the conductive particles dispersed in the sheet member-forming material are gathered at portions located between the ferromagnetic portions 52 in the top force 50 and their corresponding ferromagnetic portions 57 in the bottom force 55 and at the same time oriented so as to be arranged in the thickness-wise direction of the sheet member-forming material.

In this state, the sheet member-forming material is subjected to a curing treatment, thereby producing a sheet member comprising conductive parts arranged between the ferromagnetic portions 52 in the top force 50 and their corresponding ferromagnetic portions 57 in the bottom force 55, in which the conductive particles are closely filled, and insulating parts in which the conductive particles are not present at all or scarcely present.

<<Static Charge-eliminating Layer>>

As a conductive substance which is a material for forming a static charge-eliminating layer, may be used the selfconductive substance, hygroscopic conductive substance and the like described in the first aspect of the present invention.

Such a conductive substance may be used by itself to form the static charge-eliminating layer so far as it can form a layer by itself. However, when a substance difficult to form a layer by itself is used, or the conductivity of a static charge-eliminating layer to be formed is controlled, a proper binder may be used to form the static charge-eliminating layer.

As such a binder, may be used a thermoplastic resin material, curable resin material, paper, adhesive, that with a resin material dissolved in a solvent to impart flowability, or the like. As the curable resin, may be used that capable of being cured by radiation, heat, ion, acid or the like.

The surface resistivity of the static charge-eliminating layer is preferably at most $1 \times 10^{12}$ Ω/□, particularly preferably $1 \times 10^5$ to $1 \times 10^{10}$ Ω/□. If the surface resistivity exceeds $1 \times 10^{12}$ Ω/□, difficulty may be encountered on the sufficient prevention or inhibition of charging on the surface of the sheet in some cases. If the surface resistivity is too low on the other hand, the required insulating property in the plane direction may not be attained in some cases, when the static charge-eliminating layer is formed over the whole surface of the sheet member, for example.

The electric conductivity (inverse number of volume resistivity) of the static charge-eliminating layer is preferably at least $1 \times 10^{-7}$ $\Omega^{-1}\mathrm{m}^{-1}$, particularly preferably $1 \times 10^{-7}$ to $1 \times 10^4$ $\Omega^{-1}\mathrm{m}^{-1}$. If the electric conductivity is lower than $1 \times 10^{-7}$ $\Omega^{-1}\mathrm{m}^{-1}$, it may be difficult in some cases to sufficiently prevent or inhibit charging on the surface of the sheet. If the electric conductivity is too high on the other hand, the required insulating property in the plane direction may not be attained in some cases, when the static charge-eliminating layer is formed over the whole surface of the sheet member, for example.

A process for forming a static charge-eliminating layer on the sheet member may be suitably selected according to the material forming the static charge-eliminating layer. Specifically, the following Processes (1) to (4) may be used.

(1) A process in which a flowable composition for forming a static charge-eliminating layer, which contains a conductive substance (selfconductive substance and/or hygroscopic conductive substance), a sheet member is coated with the composition for forming the static charge-eliminating layer to form a coating film, and the coating film is then subjected to a fixing treatment;

(2) A process in which a film for static charge-eliminating layer is formed, and the film for static charge-eliminating layer is bonded to a sheet member;

(3) A process in which a sheet member is subjected to a metal plating treatment such as electroplating, electroless plating, sputtering or vapor deposition; and (4) A process in which a layer to become a static charge-eliminating layer is formed on the molding surface of a mold, and a sheet member is prepared in the mold.

In Process (1), a proper solvent may be used to impart flowability to the composition for forming the static charge-eliminating layer or control the flowability of the composition for forming the static charge-eliminating layer.

As a method for coating the surface of the sheet member with the composition for forming the static charge-eliminating layer, may be used a spraying method, a method by a brush, a dipping method, a method of coating as an LB film, a roll coating method, a method of coating by a blade (squeegee), or the like.

The fixing treatment of the coating film formed of the composition for forming the static charge-eliminating layer is selected according to the kinds of components making up the composition for forming the static charge-eliminating layer.

Specifically, when a composition obtained by containing a conductive substance capable of forming a layer in a solvent, or a composition obtained by containing a conductive substance and a binder in a solvent is used as the composition for forming the static charge-eliminating layer, a coating film of the composition for forming the static charge-eliminating layer is fixed by a drying treatment, thereby forming the static charge-eliminating layer.

When a composition containing a conductive substance and a curable material which will become a binder is used as the composition for forming the static charge-eliminating layer, a coating film of the composition for forming the static charge-eliminating layer is subjected to a curing treatment or to a drying treatment followed by a curing treatment to fix it, thereby forming the static charge-eliminating layer.

As such a composition for forming the static charge-eliminating layer as described above, may be used those generally marketed as "antistatic agents" or "conductive paints".

In Process (1), when the static charge-eliminating layer may be formed in a partial region of a surface of the sheet member, may be adopted a process in which a mask is formed with a resist, tape or the like in a region not forming the static charge-eliminating layer on the surface of the sheet member, the static charge-eliminating layer is formed with the composition for forming the static charge-eliminating layer, and the mask is then removed.

In Process (2), as a means for bonding the film for static charge-eliminating layer to the sheet member, may be adopted a means by hot pressing, or a means making use of a proper adhesive.

As the film for static charge-eliminating layer, may be used those generally marketed as "antistatic film (sheet)" or metal foils.

In Process (3), when the static charge-eliminating layer is formed in a partial region on the surface of the sheet member, may be used a process in which a mask is formed with a resist, tape or the like in a region not forming the static charge-eliminating layer on the surface of the sheet member, the static charge-eliminating layer is formed by a plating treatment, and the mask is then removed, or a process in which a metal layer is formed on the surface of the sheet member by a plating treatment, and the metal layer is subjected to photolithography and an etching treatment to remove a part thereof.

In Process (4), as a process for forming the layer to become a static charge-eliminating layer on the molding surface of the mold, any one of Processes (1) to (3) may be applied.

<<Structure of Anisotropically Conductive Sheet>>

In the anisotropically conductive sheets according to the second aspect of the present invention, no particular limitation is imposed on the specific structures thereof so far as they have such sheet member and static charge-eliminating layer as described above. Therefore, those of various structures may be adopted. The specific structural examples of the anisotropically conductive sheets according to the second aspect of the present invention will hereinafter be described.

STRUCTURAL EXAMPLE 1

Figure 24:
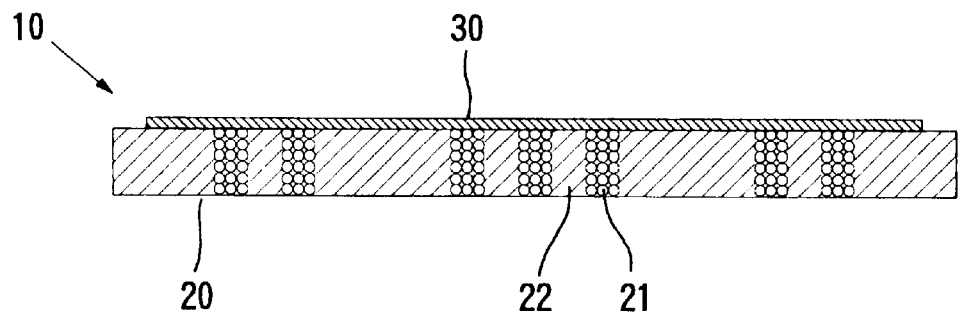
FIG. 24 is a cross-sectional view illustrating an anisotropically conductive sheet according to Structural Example 1.

A cross-sectional view illustrating an anisotropically conductive sheet according to Structural Example 1 is shown in FIG. 24. This anisotropically conductive sheet 10 is constructed by a sheet member 20 and a static charge-eliminating layer 30 provided on a surface (the upper surface in FIG. 24) of the sheet member 20 so as to cover another region than the periphery thereof.

The sheet member 20 in this example is constructed by a plurality of conductive parts 21 each extending in the thickness-wise direction of the sheet member, and insulating parts 22 which mutually insulate these conductive parts 21. In each of the conductive parts 21, conductive particles are closely filled in a state oriented so as to be arranged in the thickness-wise direction of the sheet member 20. These conductive parts 21 are arranged along the plane direction of the sheet member 20 according to a pattern corresponding to a pattern of electrodes to be connected, for example, electrodes to be inspected in a circuit device which is an inspection subject.

In the sheet member 20 of such a structure, the conductive particles are preferably contained in the conductive parts 21 in a proportion of 10 to 60%, more preferably 20 to 50% in terms of volume fraction. If this proportion is lower than 10%, the conductive parts 21 may not be provided as those sufficiently low in electric resistance value in some cases. If the proportion exceeds 60% on the other hand, the resulting conductive parts 21 tend to become brittle, so that elasticity required of the conductive parts may not be achieved in some cases.

In such an anisotropically conductive sheet 10, the surface resistivity of the static charge-eliminating layer 30 is preferably $1 \times 10^5$ to $1 \times 10^{11}$ $\Omega/\square$, more preferably $1 \times 10^7$ to $1 \times 10^9$ $\Omega/\square$, since the adjacent conductive parts 21 are in a state connected to each other by the static charge-eliminating layer 30. If the surface resistivity is lower than $10^5$ $\Omega/\square$, the required insulating property between the adjacent conductive parts may not be attained in some cases. If the surface resistivity exceeds $10^{11}$ $\Omega/\square$ on the other hand, difficulty may be encountered on the sufficient prevention or inhibition of charging on the surface of the anisotropically conductive sheet in some cases.

For the same reasons, the electric conductivity of the static charge-eliminating layer 30 is preferably $1 \times 10^{-3}$ to $1 \times 10^{-5}$ $\Omega^-\text{m}^{-1}$ when the thickness of the static charge-eliminating layer 30 is, for example, 1 mm.

STRUCTURAL EXAMPLE 2

Figure 25:
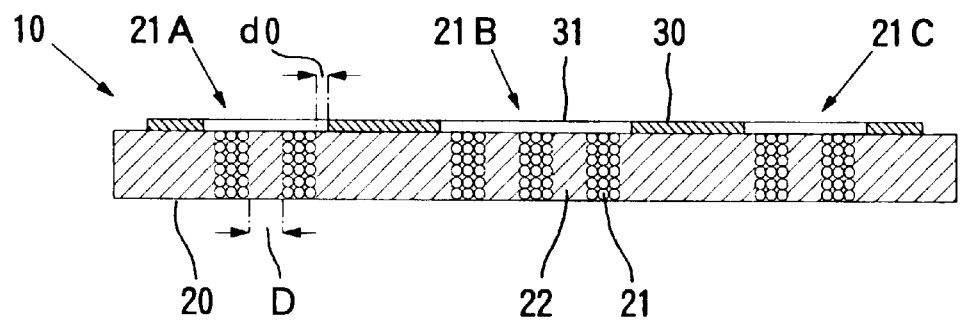
FIG. 25 is a cross-sectional view illustrating an anisotropically conductive sheet according to Structural Example 2.

A cross-sectional view illustrating an anisotropically conductive sheet according to Structural Example 2 is shown in FIG. 25. This anisotropically conductive sheet 10 has a sheet member 20 composed of a plurality of conductive parts 21 each closely filled with conductive particles and extending in the thickness-wise direction of the sheet member, and insulating parts 22 which mutually insulate these conductive parts 21. In the sheet member 20, high-density conductive part regions 21A, 21B, 21C, in each of which conductive parts 21 are arranged at a small pitch and a high density, are formed.

A static charge-eliminating layer 30, in which openings 31 have been defined, is provided on a surface of the sheet member 20. The high-density conductive part regions 21A, 21B, 21C in the sheet member 20 are in a state exposed by the openings 31 in the static charge-eliminating layer 30.

In such an anisotropically conductive sheet 10, a clearance d0 between a peripheral edge of the conductive part 21 in a surface of the sheet member 20 and an opening edge of the static charge-eliminating layer 30 is preferably at most 10 mm, more preferably at most 5 mm, particularly preferably 0.5 to 3 mm. If this clearance d0 exceeds 10 mm, a region between the peripheral edge of the conductive part 21 in one surface of the sheet member 20 and the opening edge of the static charge-eliminating layer 30 tends to be charged. If the clearance is too small on the other hand, the required insulating property in the plane direction may not be attained in some cases according to the material and thickness of the static charge-eliminating layer 30.

For the same reasons, a clearance D between adjacent conductive parts 21 in each of the high-density conductive part regions 21A, 21B, 21C is preferably at most 3 mm, particularly preferably 0.1 to 1 mm.

The thickness of the static charge-eliminating layer 30 is preferably at most 100 μm, more preferably at most 50 μm. If this thickness exceeds 100 μm, it is difficult to surely achieve electrical connection of, for example, electrodes to be inspected of a circuit device which is an inspection subject, to the conductive parts 21 of the sheet member 20 because such a static charge-eliminating layer 30 is an obstacle to the connection.

STRUCTURAL EXAMPLE 3

Figure 26:
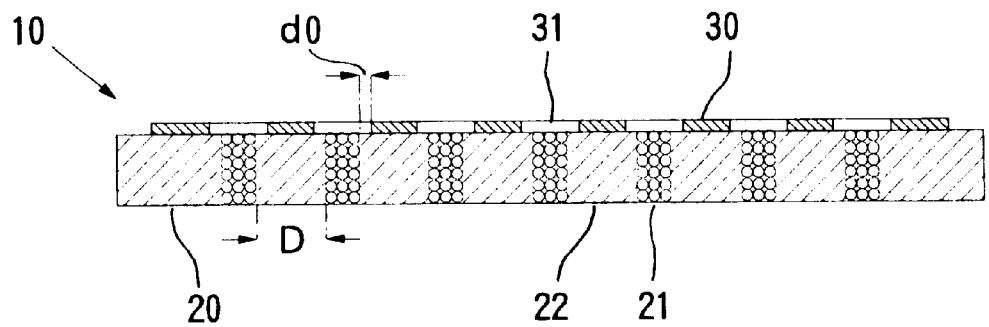
FIG. 26 is a cross-sectional view illustrating an anisotropically conductive sheet according to Structural Example 3.

A cross-sectional view illustrating an anisotropically conductive sheet according to Structural Example 3 is shown in FIG. 26. This anisotropically conductive sheet 10 has a sheet member 20 composed of a plurality of conductive parts 21 each closely filled with conductive particles and extending in the thickness-wise direction of the sheet member, and insulating parts 22 which mutually insulate these conductive parts 21. A static charge-eliminating layer 30, in which openings 31 have been defined according to a pattern corresponding to the pattern of the conductive parts 21, is provided on a surface of the sheet member 20. The respective conductive parts 21 in the sheet member 20 are in a state exposed by the openings 31 in the static charge-eliminating layer 30.

In such an anisotropically conductive sheet 10 by a reason, similar to the anisotropically conductive sheet according to Structural Example 2 described above, a clearance d0 between a peripheral edge of the conductive part 21 in a surface of the sheet member 20 and an opening edge of the static charge-eliminating layer 30 is preferably at most 5 mm, particularly preferably 0.5 to 2 mm.

When a static charge-eliminating layer 30 is provided between adjacent conductive parts 21, a clearance D between the adjacent conductive parts 21 in the sheet member 20 is preferably at least 2 mm, more preferably at least 3 mm, particularly preferably at least 5 mm. If this clearance is smaller than 2 mm, it may be difficult in some cases to form a static charge-eliminating layer 30 in a region between the adjacent conductive parts 21.

STRUCTURAL EXAMPLE 4

Figure 27:
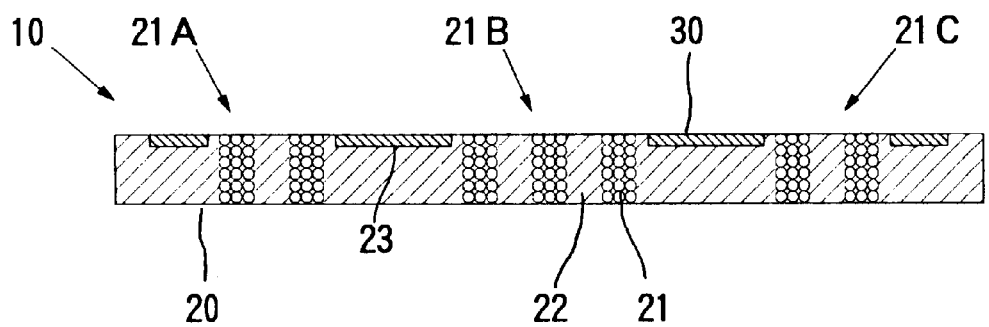
FIG. 27 is a cross-sectional view illustrating an anisotropically conductive sheet according to Structural Example 4.

A cross-sectional view illustrating an anisotropically conductive sheet according to Structural Example 4 is shown in FIG. 27. This anisotropically conductive sheet 10 has a sheet member 20 composed of a plurality of conductive parts 21 each closely filled with conductive particles and extending in the thickness-wise direction of the sheet member, and insulating parts 22 which mutually insulate these conductive parts 21. In the sheet member 20, high-density conductive part regions 21A, 21B, 21C, in each of which conductive parts 21 are arranged at a small pitch and a high density, are formed. Recesses 23 are formed in other regions than the high-density conductive part regions 21A, 21B, 21C in a surface of the sheet member 20, and static charge-eliminating layers 30 are provided in the recesses 23.

STRUCTURAL EXAMPLE 5

Figure 28:
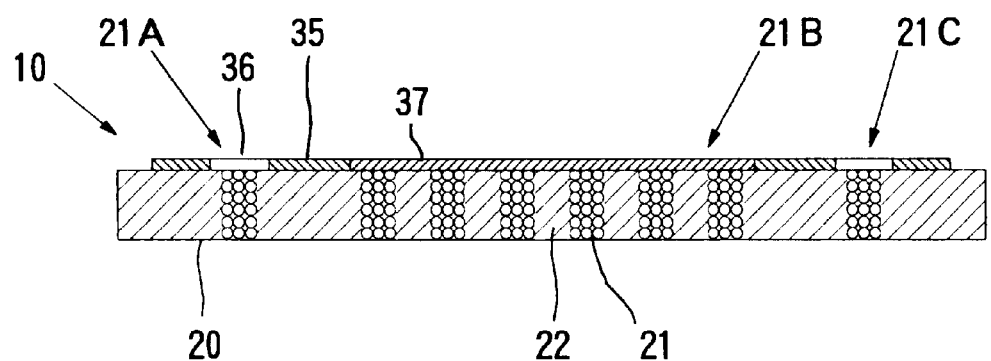
FIG. 28 is a cross-sectional view illustrating an anisotropically conductive sheet according to Structural Example 5.
Figure 29:
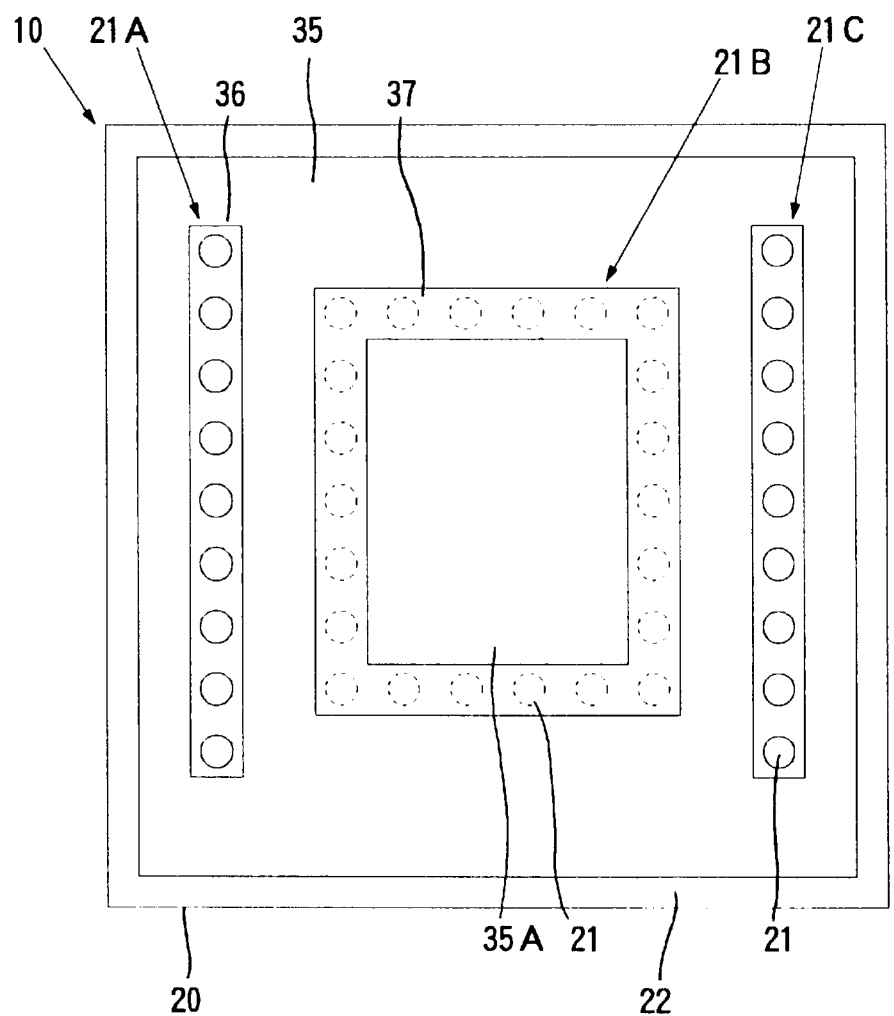
FIG. 29 is a plan view illustrating the anisotropically conductive sheet according to Structural Example 5.

A cross-sectional view illustrating an anisotropically conductive sheet according to Structural Example 5 is shown in FIG. 28, and a plan view of the anisotropically conductive sheet is shown in FIG. 29. This anisotropically conductive sheet 10 has a sheet member 20 composed of a plurality of conductive parts 21 each closely filled with conductive particles and extending in the thickness-wise direction of the sheet member, and insulating parts 22 which mutually insulate these conductive parts 21. In the sheet member 20, high-density conductive part regions 21A, 21B, 21C, in each of which conductive parts 21 are arranged at a small pitch and a high density, are formed. In the high-density conductive part region 21B, the conductive parts 21 are arranged in an area having a form of a rectangular frame as illustrated in FIG. 29. A high-conductive, static charge-eliminating layer 35, in which openings for exposing the high-density conductive part regions 21A, 21B, 21C have been defined, is provided on a surface of the sheet member 20, and a low-conductive, static charge-eliminating layer 37 is provided in the high-density conductive part region 21B in the form of a rectangular frame, in which the conductive parts 21 are arranged, so as to cover the opening 36 for exposing the high-density conductive part region 21B in the high-conductive, static charge-eliminating layer 35.

In the anisotropically conductive sheet 10 described above, the high-conductive, static charge-eliminating layer 35 preferably has a surface resistivity of at most $1 \times 10^8$ $\Omega/\square$ and an electric conductivity of at least $1 \times 10^{-4}$ $\Omega^{-1}m^{-1}$, particularly preferably, the surface resistivity is $1 \times 10^5$ to $1 \times 10^7$ $\Omega/\square$, and the electric conductivity is $1 \times 10^{-1}$ to $1 \times 10^{-3}$ $\Omega^{-1}m^{-1}$, when the thickness thereof is, for example, 0.1 mm.

The low-conductive, static charge-eliminating layer 37 preferably has a surface resistivity of $1 \times 10^8$ to $1 \times 10 \, \Omega/\square$ and an electric conductivity of $1 \times 10^{-4}$ to $1 \times 10^{-8}$ $\Omega^{-1}m^{-1}$, particularly preferably, the surface resistivity is $2.5 \times 10^9$ to $2.5 \times 10^{11}$ $\Omega/\square$, and the electric conductivity is $1 \times 10^{-5}$ to $1 \times 10^{-7}$ $\Omega^{-1}m^{-1}$, when the thickness thereof is, for example, 0.1 mm.

According to such an anisotropically conductive sheet 10, charging can be prevented or inhibited with high efficiency because the high-conductive, static charge-eliminating layer 35 is provided in other regions than the high-density conductive part regions 21A, 21B, 21C. In addition, in the region (hereinafter referred to as "independent region") surrounded by the high-density conductive part region 21B in the form of a rectangular frame, the high-conductive, static charge-eliminating layer 35A formed on the independent region is connected to the high-conductive, static charge-eliminating layers 35 formed in other regions than the independent region through the low-conductive, static charge-eliminating layer 37 formed on the high-density conductive part region 21B, so that charging can be surely prevented or inhibited.

STRUCTURAL EXAMPLE 6

Figure 30:
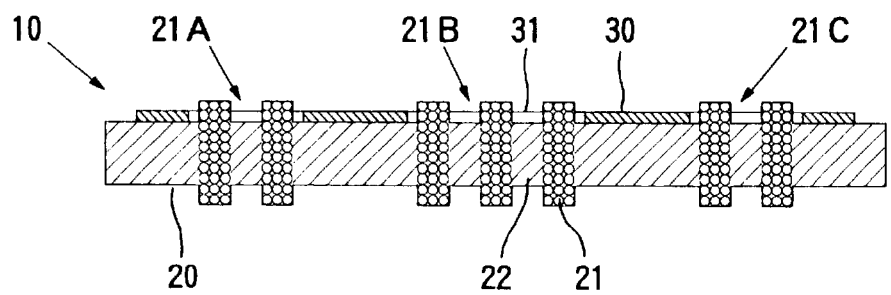
FIG. 30 is a cross-sectional view illustrating an anisotropically conductive sheet according to Structural Example 6.
Figure 3:
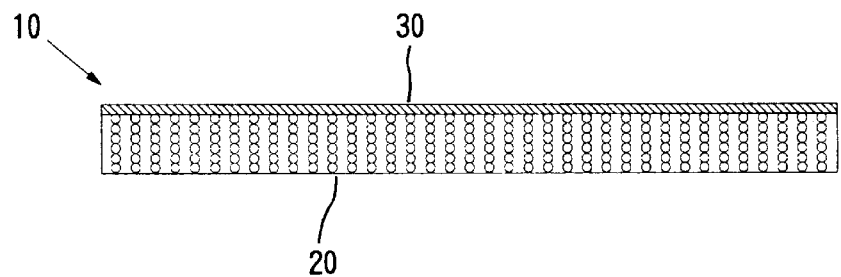
Figure 3:
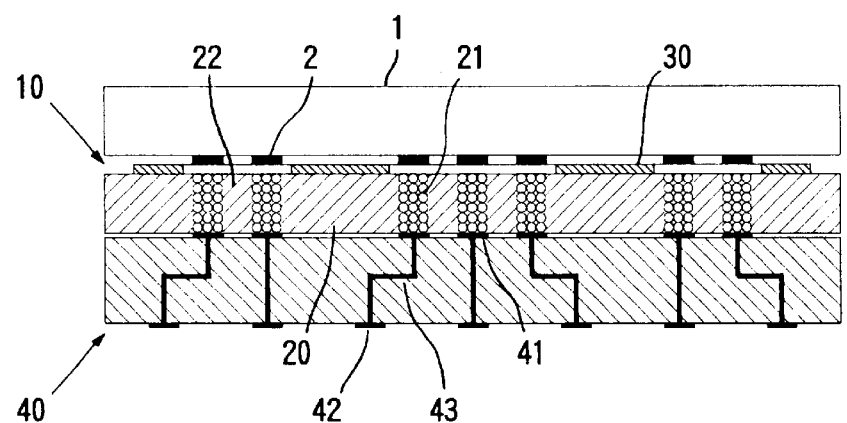
Figure 3:
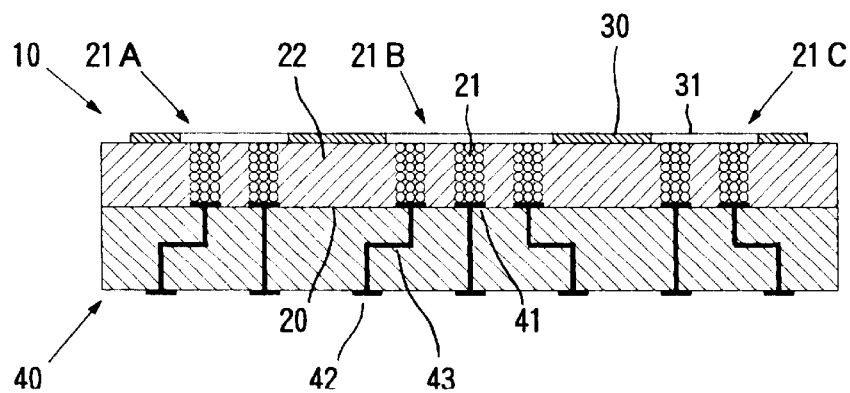

A cross-sectional view illustrating an anisotropically conductive sheet according to Structural Example 6 is shown in FIG. 30. This anisotropically conductive sheet 10 has a sheet member 20 composed of a plurality of conductive parts 21 each closely filled with conductive particles and extending in the thickness-wise direction of the sheet member, and insulating parts 22 which mutually insulate these conductive parts 21. In the sheet member 20, high-density conductive part regions 21A, 21B, 21C, in each of which conductive parts 21 are arranged at a small pitch and a high density, are formed. In this example, each of the conductive parts 21 in the sheet member 20 is formed in a state projected from both surfaces of the insulating parts 22.

A static charge-eliminating layer 30, in which openings 31 have been defined, is provided on a surface of the sheet member 20. The high-density conductive part regions 21A, 21B, 21C in the sheet member 20 are in a state exposed by the openings 31 in the static charge-eliminating layer 30.

In such an anisotropically conductive sheet 10, the projected height of each conductive part 21 in the sheet member 20 is preferably greater than the thickness of the static charge-eliminating layer 30, particularly preferably 2 to 10 times as long as the thickness of the static charge-eliminating layer 30.

STRUCTURAL EXAMPLE 7

A cross-sectional view illustrating an anisotropically conductive sheet according to Structural Example 7 is shown in FIG. 31. In this anisotropically conductive sheet 10, a sheet member 20 is constructed by containing conductive particles over the whole base material composed of an elastic polymeric substance so as to be arranged in the thickness-wise direction of the sheet. The anisotropically conductive sheet 10 is such that conductive paths are formed by the conductive particles at any portions, at which the surface of the sheet member 20 is pressurized in the thickness-wise direction.

In the sheet member 20 of such a construction, the conductive particles are preferably contained in the base material in a proportion of 3 to 50%, more preferably 5 to 30% in terms of volume fraction. If this proportion is lower than 3%, it may be difficult in some cases to form conductive paths sufficiently low in electric resistance. If the proportion exceeds 50% on the other hand, in some cases, the resulting sheet member 20 may become brittle, or it may exhibit conductivity even in the plane direction not to exhibit the required anisotropic conductivity.

A static charge-eliminating layer 30 is provided on a surface of the sheet member 20 so as to cover the whole surface.

In such an anisotropically conductive sheet 10, the surface resistivity of the static charge-eliminating layer 30 is preferably $1 \times 10^6$ to $1 \times 10^{11}$ $\Omega/\square$, more preferably $1 \times 10^8$ to $1 \times 10^{10}$ $\Omega/\square$. If the surface resistivity is lower than $1 \times 10^6$ $\Omega/\square$, the required insulating property in the plane direction of the sheet may not be achieved in some cases. If the surface resistivity exceeds $1 \times 10^{11}$ $\Omega/\square$ on the other hand, difficulty may be encountered on the sufficient prevention or inhibition of charging on the surface of the anisotropically conductive sheet in some cases.

For the same reasons, the electric conductivity of the static charge-eliminating layer 30 is preferably $1 \times 10^{-4}$ to $1 \times 10^{-6}$ $\Omega^{-1}m^{-1}$ when the thickness of the static charge-eliminating layer 30 is, for example, 0.1 mm.

<<Usage of Anisotropically Conductive Sheet>>

The anisotropically conductive sheets in the second aspect of the present invention may be suitably used in electrical inspection of circuit devices. The case where the anisotropically conductive sheet 10 according to Structural Example 2 described above is used to conduct electrical inspection will hereinafter be described.

In the electrical inspection of a circuit device, as illustrated in FIG. 32, is provided a connector plate 40 which has electrodes 41 for connection arranged according to a pattern corresponding to electrodes 2 to be inspected in the circuit device 1 to be inspected on its front surface and has terminal electrodes 42 electrically connected to the electrodes 41 for connection through wiring parts 43 and arranged according to a lattice-point arrangement of, for example, a pitch of 2.54 mm, 1.80 mm or 1.27 mm on its back surface. The anisotropically conductive sheet 10 is arranged on the front surface of the connector plate 40 in such a manner that the conductive parts 21 in the sheet member 20 are located on the electrodes 41 for connection, and the circuit device 1 to be inspected is arranged on the anisotropically conductive sheet 10 in such a manner that its electrodes 2 to be inspected are located on the conductive parts 21 in the sheet member 20 of the anisotropically conductive sheet 10. The anisotropically conductive sheet 10 is arranged in such a manner that the static charge-eliminating layer 30 is located on the side of the circuit device 2, and the static charge-eliminating layer 30 is grounded by a suitable means.

For example, the connector plate 40 is moved in a direction close to the circuit device 1 to be inspected, whereby the anisotropically conductive sheet 10 becomes a state pressurized by the circuit device 1 to be inspected and the connector plate 40. Active conductive paths extending in the thickness-wise direction of the sheet are formed in the conductive parts 21 in the sheet member 20 of the anisotropically conductive sheet 10 by this applied pressure. As a result, electrical connection between the electrodes 2 to be inspected in the circuit device 1 to be inspected and the electrodes 41 for connection in the connector plate 40 is achieved to conduct required electrical inspection in this state.

After completion of the electrical inspection of the circuit device 1 to be inspected, the circuit device 1 to be inspected is changed to another circuit device to be inspected, and the same operation as described above is repeated on said circuit device to be inspected, thereby conducting the electrical inspection thereof.

According to the anisotropically conductive sheet 10 according to the second aspect of the present invention, the static charge-eliminating layer 30 is provided on a surface of the sheet member 20, so that the anisotropically conductive sheet 10 can be prevented or inhibited from being charged by generation of static electricity on the surface thereof by grounding the static charge-eliminating layer 30. Therefore, when the anisotropically conductive sheet 10 according to the second aspect of the present invention is used in electrical inspection of circuit devices such as printed circuit boards and semiconductor integrated circuits, it is unnecessary to stop inspecting operations to conduct static charge-eliminating operation on the anisotropically conductive sheet. Therefore, the electrical inspection of circuit devices can be conducted with high time efficiency.

The anisotropically conductive sheets 10 according to the second aspect of the present invention are not limited to the embodiments described above, and various modifications may be added thereto.

For example, in Structural Examples 1 to 7 described above, the static charge-eliminating layer 30 may be provided on both surfaces of the sheet member 20.

A plurality of the static charge-eliminating layers 30 may be provided in laminated manner.

As illustrated in FIG. 33, the anisotropically conductive sheet 10 may be provided integrally on, for example, the surface of a connector plate 40 used in the electrical inspection of circuit devices.

The second aspect of the present invention will hereinafter be described by the following Examples.

In the following Examples, the details of a sheet member used are as follows:

[Form]

A plurality of conductive parts each closely filled with conductive particles and extending in the thickness-wise direction of the sheet is arranged in a state mutually insulated by insulating parts (uneven distribution type):

Thickness: 1.2 mm; diameter of conductive part: 0.8 mm; pitch of conductive part: 1.5 mm.

[Base Material]

Addition type silicone rubber.

[Conductive Particles]

Nickel particles having an average particle diameter of 40 μm plated with gold.

EXAMPLE 1

A composition for forming a static charge-eliminating layer was applied to a surface of a sheet member by brushing and subjected to a drying treatment, thereby forming a static charge-eliminating layer having a thickness of 10 μm, thereby producing an anisotropically conductive sheet according to Structural Example 1.

In the above process, an antistatic agent containing a nonionic surfactant was used as the composition for forming the static charge-eliminating layer.

The surface resistivity of the static charge-eliminating layer thus formed was measured, and moreover an electric resistance between adjacent conductive parts in the sheet member was measured. The measured results are shown in Table 1.

EXAMPLE 2

A static charge-eliminating layer having a thickness of 10 μm was formed on a surface of the sheet member in the same manner as in Example 1 except that an antistatic agent containing a siloxane compound was used as the composition for forming the static charge-eliminating layer, thereby producing an anisotropically conductive sheet according to Structural Example 1.

The surface resistivity of the static charge-eliminating layer thus formed and an electric resistance between adjacent conductive parts in the sheet member were measured are shown in Table 1.

EXAMPLE 3

A static charge-eliminating layer having a thickness of 10 μm was formed on a surface of the sheet member in the same manner as in Example 1 except that an antistatic agent containing an acrylic conductive polymer was used as the composition for forming the static charge-eliminating layer, thereby producing an anisotropically conductive sheet according to Structural Example 1.

The surface resistivity of the static charge-eliminating layer thus formed and an electric resistance between adjacent conductive parts in the sheet member were measured are shown in Table 1.

EXAMPLE 4

A static charge-eliminating layer having a thickness of 10 μm was formed on a surface of the sheet member in the same manner as in Example 1 except that an antistatic agent containing a conductive metal oxide was used as the composition for forming the static charge-eliminating layer, thereby producing an anisotropically conductive sheet according to Structural Example 1.

The surface resistivity of the static charge-eliminating layer thus formed and an electric resistance between adjacent conductive parts in the sheet member were measured are shown in Table 1.

EXAMPLE 5

A static charge-eliminating layer having a thickness of 10 μm was formed on a surface of the sheet member in the same manner as in Example 1 except that an antistatic agent containing sodium alkanesulfonate ($C_nH_{2n+1}SO_3Na$(n=12–20)) was used as the composition for forming the static charge-eliminating layer, thereby producing an anisotropically conductive sheet according to Structural Example 1.

The surface resistivity of the static charge-eliminating layer thus formed and an electric resistance between adjacent conductive parts in the sheet member were measured are shown in Table 1.

TEST EXAMPLE 1

Each of the anisotropically conductive sheets according to Examples 1 to 5 was fixed to a glass fiber-reinforced epoxy substrate (dimensions: 14 cm×14 cm×1 mm) with the static charge-eliminating layer upward. This was arranged on an aluminum plate (dimensions: 30 cm×30 cm×2 mm) grounded with the anisotropically conductive sheet upward. The anisotropically conductive sheet was then pressurized for 2 seconds under a load of 130 kgf by means of a copper-clad glass fiber-reinforced epoxy substrate (10 cm×10 cm×0.5 mm), on the surface of which a resist layer had been formed, under conditions of a temperature of 28° C. and a relative humidity of about 50%. This process was conducted 200 times in total.

After 50 seconds elapsed from completion of the test, and 300 seconds elapsed, the surface potential of the anisotropically conductive sheet was measured.

As a comparative example, the same test as described above was conducted on a sheet member on which no static charge-eliminating layer was formed.

The results of the test are shown in Table 1.

TABLE 1

| | Surface resistivity of static charge-eliminating layer ($\Omega/\square$) | Electric resistance between adjacent conductive parts (M$\Omega$) | Surface potential (kV) | |
|---|---|---|---|---|
| | | | 50 seconds elapsed | 300 seconds elapsed |
| Example 1 | $3 \times 10^8$ | >100 | −0.2 | −0.1 |
| Example 2 | $5 \times 10^9$ | >100 | −0.6 | −0.2 |
| Example 3 | $2 \times 10^8$ | >100 | −0.2 | −0.1 |
| Example 4 | $2 \times 10^8$ | >100 | −0.2 | −0.1 |
| Example 5 | $2 \times 10^8$ | >100 | −0.2 | −0.1 |
| Comparative Example | — | >100 | −4.3 | −3.9 |

As apparent from the results shown in Table 1, the surface potential values after 50 seconds and 300 seconds elapsed from completion of the test were all small according to the anisotropically conductive sheets of Examples 1 to 5. Therefore, it was confirmed that charging by generation of static electricity on the surface is surely inhibited.

On the other hand, the surface potential values after 50 seconds and 300 seconds elapsed from completion of the test were both great in the comparative example, which revealed that charging by generation of static electricity on the surface occurred.

EXAMPLE 6

A film for static-charge elimination layer having a thickness of 70 $\mu$m, in which carbon black was contained in a polyethylene resin, was bonded to the surface of the sheet member by contact bonding, thereby forming a static charge-eliminating layer to produce an anisotropically conductive sheet according to Structural Example 2.

The surface resistivity of the static charge-eliminating layer thus formed and an electric resistance between adjacent conductive parts in the sheet member were measured are shown in Table 2.

EXAMPLE 7

A static charge-eliminating layer was formed in the same manner as in Example 6 except that a film for static-charge elimination layer having a thickness of 100 $\mu$m, in which organic conductive fiber was contained in a base material composed of paper, was used, thereby producing an anisotropically conductive sheet according to Structural Example 2.

The surface resistivity of the static charge-eliminating layer thus formed and an electric resistance between adjacent conductive parts in the sheet member were measured are shown in Table 2.

TEST EXAMPLE 2

Each of the anisotropically conductive sheets according to Examples 6 and 7 was fixed to a glass fiber-reinforced epoxy substrate (dimensions: 14 cm×14 cm×1 mm) with the static charge-eliminating layer upward. This was arranged on an aluminum plate (dimensions: 30 cm×30 cm×2 mm) grounded with the anisotropically conductive sheet upward. The anisotropically conductive sheet was then pressurized for 2 seconds under a load of 130 kgf by means of a copper-clad glass fiber-reinforced epoxy substrate (10 cm×10 cm×0.5 mm), on the surface of which a resist layer had been formed, under conditions of a temperature of 27° C. and a relative humidity of about 27%. This process was conducted 50 times in total.

Right after the test was completed, the surface potential of the anisotropically conductive sheet was measured.

As a comparative example, the same test as described above was conducted on a sheet member on which no static charge-eliminating layer was formed.

The results of the test are shown in Table 2.

TABLE 2

|  | Surface resistivity of static charge-eliminating layer ($\Omega/\square$) | Electric resistance between adjacent conductive parts (M$\Omega$) | Surface potential (kV) |
| --- | --- | --- | --- |
| Example 6 | $2 \times 10^9$ | >100 | −0.11 |
| Example 7 | $3 \times 10^{10}$ | >100 | −0.35 |
| Comparative Example | — | >100 | −1.84 |

As apparent from the results shown in Table 2, the surface potential values right after the test was completed were both small according to the anisotropically conductive sheets of Examples 6 and 7. Therefore, it was confirmed that charging by generation of static electricity on the surface is surely inhibited.

On the other hand, the surface potential value right after the test was completed was great in the comparative example, which revealed that charging by generation of static electricity on the surface occurred.

Third Aspect of the Invention

Figure 34:
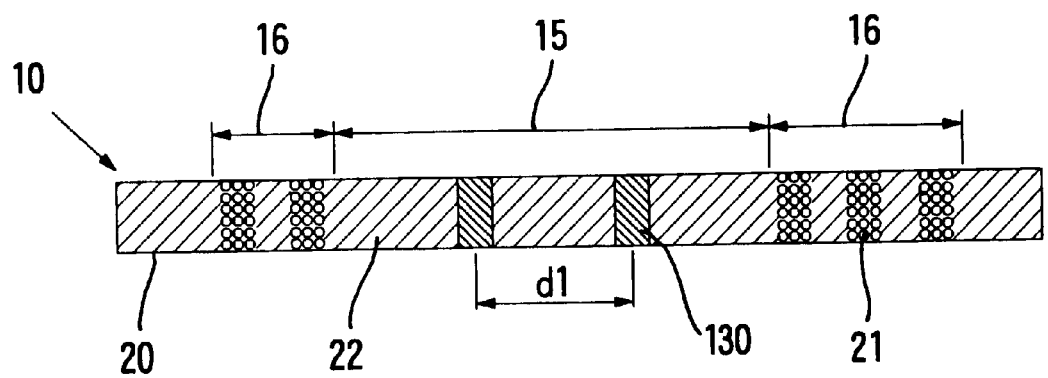
FIG. 34 is a cross-sectional view illustrating an example of the construction of an anisotropically conductive sheet according to the third aspect of the present invention.

FIG. 34 is a cross-sectional view illustrating an example of the construction of an anisotropically conductive sheet according to the third aspect of the present invention. The sheet member 20 in this anisotropically conductive sheet 10 is constructed by a plurality of columnar conductive parts 21 for connection each extending in the thickness-wise direction of the sheet and insulating parts 22 which insulate these conductive parts 21 for connection mutually. These conductive parts 21 for connection are arranged along the plane direction of the sheet member 20 according to a pattern of electrodes to be connected, for example, electrodes to be inspected in a circuit device to be inspected.

At least one conductive part 130 for static-charge elimination is arranged in a blank region 15 outside a region 16, in which the conductive parts for connection are arranged, in the sheet member 20. The conductive part 130 for static-charge elimination is electrically connected to a ground terminal provided in a connector device having electrodes for connection arranged corresponding to electrodes to be inspection in a circuit device.

As the sheet member 20, may be used those of various structures so far as they are anisotropically conductive sheets having conductivity in the thickness-wise direction. However, a sheet member, in which conductive particles are contained in a base material composed of an elastic polymeric substance in a state oriented so as to be arranged in the thickness-wise direction of the sheet member 20, may be preferably used.

As the elastic polymeric substance forming the base material of the sheet member 20, the same elastic polymeric substance as that forming the base material of the conductive parts in the first aspect of the present invention may be used under the same conditions.

As the conductive particles contained in the base material in the sheet member 20, the same conductive particles as those in the first aspect of the present invention may be used under the same conditions.

Figure 35:
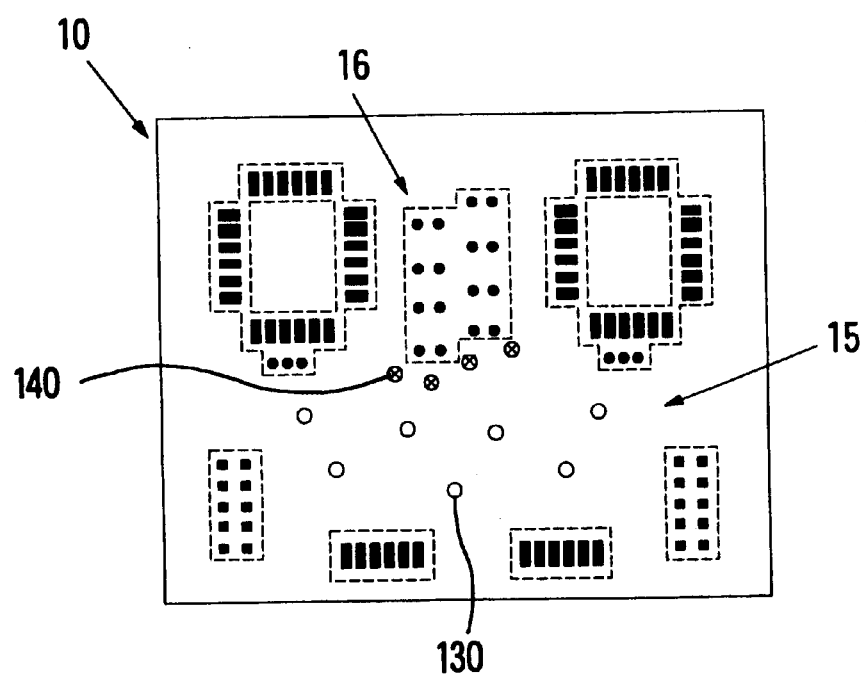
FIG. 35 is a plan view illustrating an exemplary arrangement of conductive parts for static-charge elimination in the anisotropically conductive sheet according to the third aspect of the present invention.

The conductive part 130 for static-charge elimination in this anisotropically conductive sheet 10 is a conductive part (hereinafter referred to as "antistatic conductive part") having a function that mainly inhibits the surface of the anisotropically conductive sheet 10 from bearing static electricity, or electrically neutralizes and eliminates accumulated electric charge while it is slight, and is dispersively arranged in the blank region 15 outside the region 16, in which the conductive parts for connection are arranged, as also illustrated in FIG. 35. In this embodiment, the region 16, in which the conductive parts for connection are arranged, means a region in which one or plural conductive parts 21 for connection are arranged collectively, while the blank region 15 means a region having at least a certain area in which no conductive part 21 for connection is present.

In FIG. 35, another conductive part 140 for static-charge elimination than the antistatic conductive part 130 is illustrated with the antistatic conductive part 130 for convenience's sake. The details of the conductive part 140 for static-charge elimination will be described subsequently.

An interval that the antistatic conductive part 130 is arranged varies according to use or size of the resulting anisotropically conductive sheet 10. When it is used in, for example, electrical inspection of printed circuit boards, the maximum value of a clearance between the antistatic conductive part 130 and the conductive part for connection closest thereto and the maximum value of a clearance d1 between adjacent antistatic conductive parts 130 are preferably at most 4 cm, more preferably at most 3 cm, still more preferably at most 2 cm. When the maximum value of the clearance d1 is at most 4 cm, the surface of the anisotropically conductive sheet 10 can be fully inhibited from bearing static electricity, and an adverse influence of static electricity on the conductive parts 21 for connection can be excluded.

For the same reason, when it is used in, for example, electrical inspection of semiconductor integrated circuits, the maximum value of a clearance between the antistatic conductive part 130 and the conductive part for connection closest thereto and the maximum value of a clearance between adjacent antistatic conductive parts are preferably at most 10 mm, more preferably at most 5 mm, still more preferably at most 3 mm.

The antistatic conductive part 130 is constructed by, for example, dispersing a conductive substance in a base material composed of a polymeric substance. As the polymeric substance forming the base material, may be used those used as the elastic polymeric substance forming the base material of the sheet member 20.

As the conductive substance contained in the base material forming the antistatic conductive part 130, may be used the selfconductive substance, hygroscopic conductive substance and the like described in the first aspect of the present invention.

The antistatic conductive part 130 preferably has an electric resistance value of at most 100 MΩ, more preferably at most 10 MΩ, still more preferably at most 1 MΩ. When the electric resistance value of the antistatic conductive part 130 is at most 100 MΩ, static electricity generated on the surface of the anisotropically conductive sheet 10 can be quickly eliminated to inhibit the surface of the anisotropically conductive sheet 10 from bearing static electricity.

No particular limitation is imposed on the planar form of the antistatic conductive part 130 so far as stable electric conduction can be ensured. It may be formed into, for example, a square of from about 100 μm to about 1 mm in a side, or a circle of from about 100 μm to about 1 mm in diameter.

The surface of the antistatic conductive part 130 is preferably the same level as the surfaces of the insulating parts 22 surrounding said antistatic conductive part 130. However, there is no need to make strictly equal. For example, even when the level is different within limits of about 100 μm to 500 μm, the antistatic effect is not impaired, or electrical connection upon inspection is not prevented.

Such an anisotropically conductive sheet can be produced in accordance with, for example, the following Process (i) or (ii).

Figure 36:
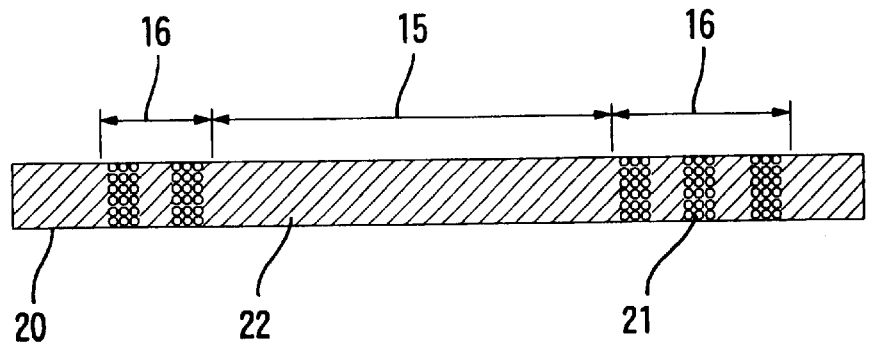
FIG. 36 is a cross-sectional view illustrating a sheet member.
Figure 37:
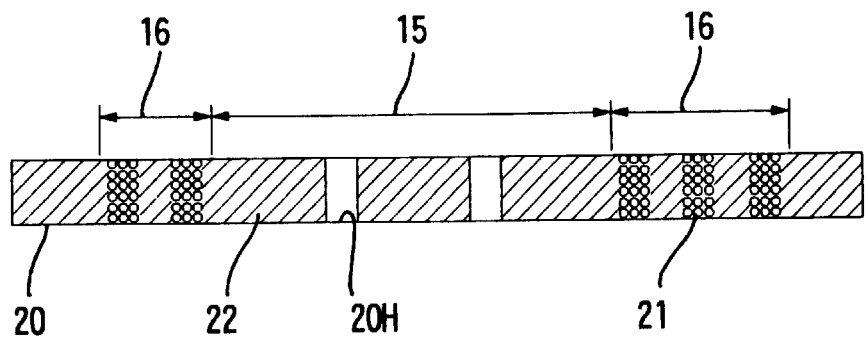
FIG. 37 is a cross-sectional view illustrating a state that through-holes have been made in the sheet member.

Process (i):

In Process (i), a sheet member 20 composed of an elastic polymeric substance, in which a plurality of conductive parts 21 for connection each extending in the thickness-wise direction thereof are arranged according to the intended arrangement pattern in a state mutually insulated by insulating parts 22 as illustrated in FIG. 36, is provided. A plurality of through-holes 20H is made in a blank region 15 of the sheet member 20 according to an arrangement pattern of the antistatic conductive parts 130 to be formed as illustrated in FIG. 37.

As a means for making the through-holes 20H in the sheet member 20, may be used a means by laser processing, a means by punching making use of a punch, a means by drilling, or the like.

Figure 38:
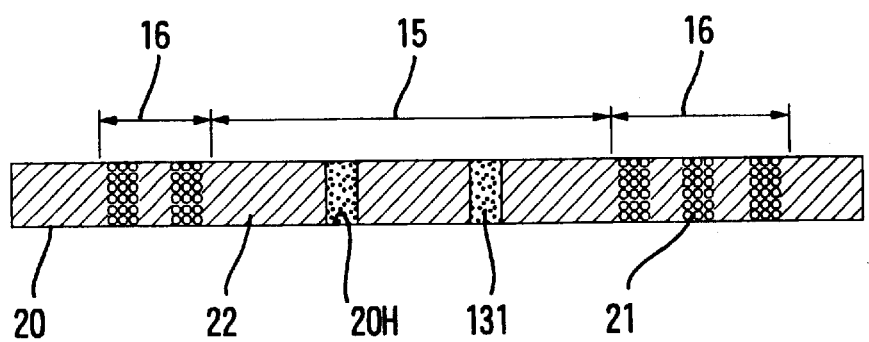
FIG. 38 is a cross-sectional view illustrating a state that a material layer for forming conductive parts for static-charge elimination has been formed in each of the through-holes in the sheet member.

On the other hand, a flowable material 131 for forming antistatic conductive parts, in which a conductive substance is dispersed in a polymer-forming material, is prepared. The material 131 for forming antistatic conductive parts is filled into the through-holes 20H in the sheet member 20 as illustrated in FIG. 38. Thereafter, the material 131 for forming antistatic conductive parts is subjected to a curing treatment, thereby forming antistatic conductive parts 130 to produce an anisotropically conductive sheet 10 of a structure illustrated in FIG. 34.

Figure 39:
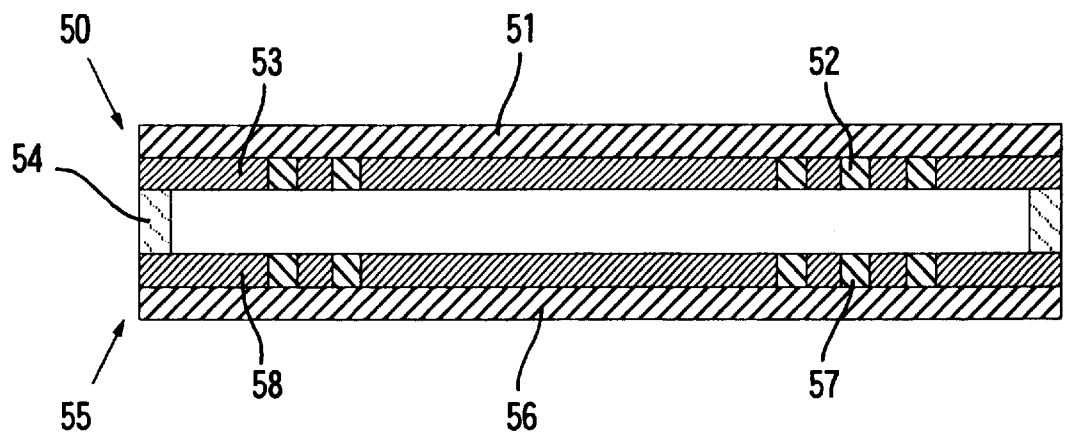
FIG. 39 is a cross-sectional view illustrating the construction of an exemplary mold used for producing an anisotropically conductive sheet according to the third aspect of the present invention.

Process (ii):

In Process (ii), as illustrated in FIG. 39, for example, a mold constructed by arranging a top force 50 and a bottom force 55 making a pair therewith so as to be opposed to each other through a frame-like spacer 54 is used.

In the top force 50, ferromagnetic portions 52 are formed according to a pattern corresponding to the arrangement pattern of the conductive parts 21 for connection of the intended anisotropically conductive sheet 10 on the lower surface of a ferromagnetic base plate 51, and non-magnetic portions 53 are formed at other areas than the ferromagnetic portions 52.

In the bottom force 55 on the other hand, ferromagnetic portions 57 are formed according to a pattern corresponding to the arrangement pattern of the conductive parts 21 for connection of the intended anisotropically conductive sheet 10 on the upper surface of a ferromagnetic base plate 56, and non-magnetic portions 58 are formed at other areas than the ferromagnetic portions 57.

As a material for forming the ferromagnetic base plates 51, 56 and ferromagnetic portions 52, 57 in both top force 50 and bottom force 55, may be used iron, nickel, cobalt or an alloy thereof, or the like.

As a material for forming the non-magnetic portions 53, 58 in both top force 50 and bottom force 55, may be used a non-magnetic metal such as copper, a heat-resistant resin such as polyimide, or the like.

Figure 40:
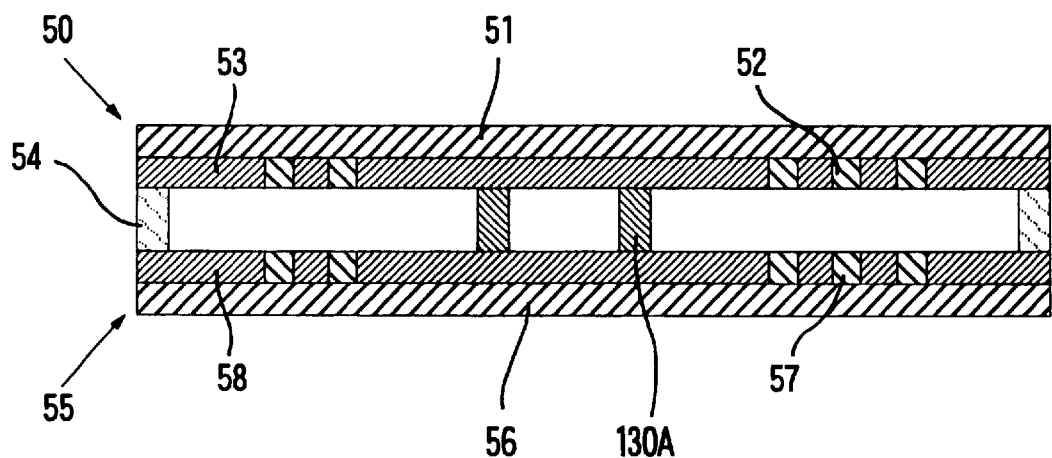
FIG. 40 is a cross-sectional view illustrating a state that a material for antistatic conductive part has been arranged in the mold shown in FIG. 39.
Figure 4:
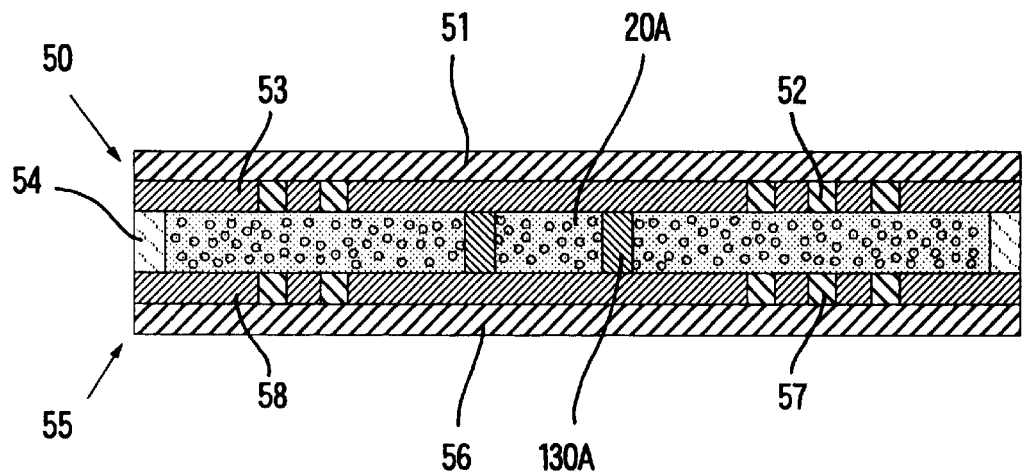
Figure 4:
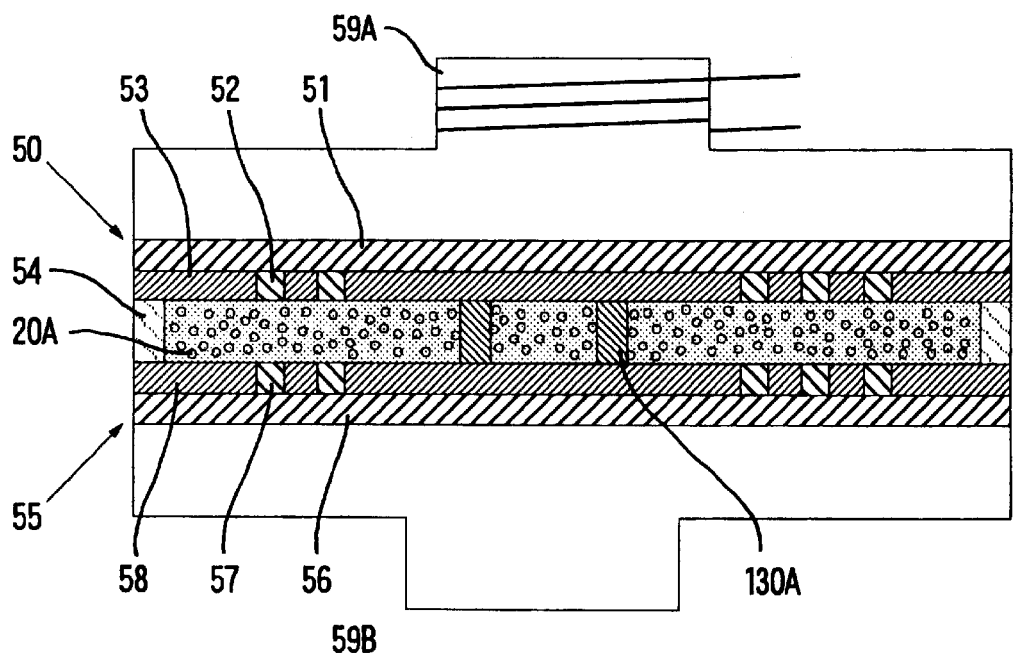

In Process (ii), as illustrated in FIG. 40, preformed materials 130A for antistatic conductive part to become an antistatic conductive part 130 are first arranged at positions corresponding to the arrangement pattern of antistatic conductive parts 130 to be formed in a region in the mold to become a blank region 15. A pasty sheet member-forming material 20A, in which conductive particles exhibiting magnetism are dispersed in a polymeric substance-forming material which will become an elastic polymeric substance by curing, is filled into the mold so as to surround the materials 130A for antistatic conductive part as illustrated in FIG. 41.

Thereafter, a pair of electromagnets 59A, 59B are arranged on the upper surface of the ferromagnetic base plate 51 in the top force 50 and the lower surface of the ferromagnetic base plate 56 in the bottom force 55 as illustrated in FIG. 42, and the electromagnets 59A, 59B are energized, thereby applying a parallel magnetic field having an intensity distribution, i.e., a parallel magnetic field having high intensity between the ferromagnetic portions 52 in the top force 50 and their corresponding ferromagnetic portions 57 in the bottom force 55, to the sheet member-forming material 20A in the thickness-wise direction thereof. As a result, in the sheet member-forming material 20A, the conductive particles dispersed in the sheet member-forming material 20A are gathered at portions located between the ferromagnetic portions 52 in the top force 50 and their corresponding ferromagnetic portions 57 in the bottom force 55 and at the same time oriented so as to be arranged in the thickness-wise direction of the sheet member-forming material 20A.

Figure 43:
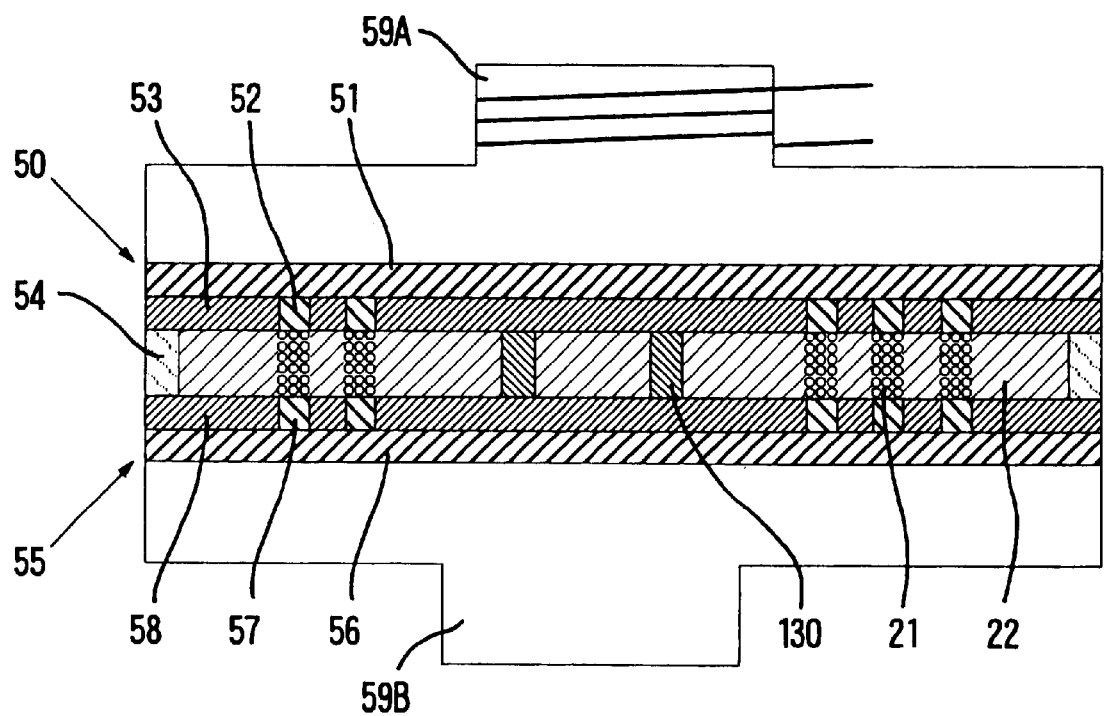
FIG. 43 is a cross-sectional view illustrating a state that the sheet member-forming material layer has been subjected to a curing treatment to form conductive parts for connection and insulating parts.

In this state, the sheet member-forming material 20A is subjected to a curing treatment, thereby forming conductive parts 21 for connection arranged between the ferromagnetic portions 52 in the top force 50 and their corresponding ferromagnetic portions 57 in the bottom force 55, in which the conductive particles are closely filled in the elastic polymeric substance, and insulating parts 22, in which the conductive particles are not present at all or scarcely present, as illustrated in FIG. 43, to produce an anisotropic conductive sheet 10 illustrated in FIG. 34.

In the above-described process, the curing treatment of the sheet member-forming material 20A may be conducted in the state that the parallel magnetic field is being applied. However, the treatment may also be conducted after stopping the application of the parallel magnetic field. The intensity of the parallel magnetic field, means and curing treatment are the same as those in the first aspect of the present invention.

According to the anisotropically conductive sheet 10 described above, the antistatic conductive parts 130 are arranged in a state dispersively arranged in the blank region 15, whereby static electricity generated by repeated pressurizing operation and separation operation in, for example, the electrical inspection of circuit devices can be eliminated through the antistatic conductive parts 130. As a result, the accumulation of electric charge on the surface of the anisotropically conductive sheet can be sufficiently inhibited in all positions within the blank region 15 to prevent the generation of high-potential static electricity. Accordingly, an adverse influence of static electricity on the conductive parts 21 for connection can be excluded, and the electrical inspection can be conducted with high efficiency and safety.

Figure 44:
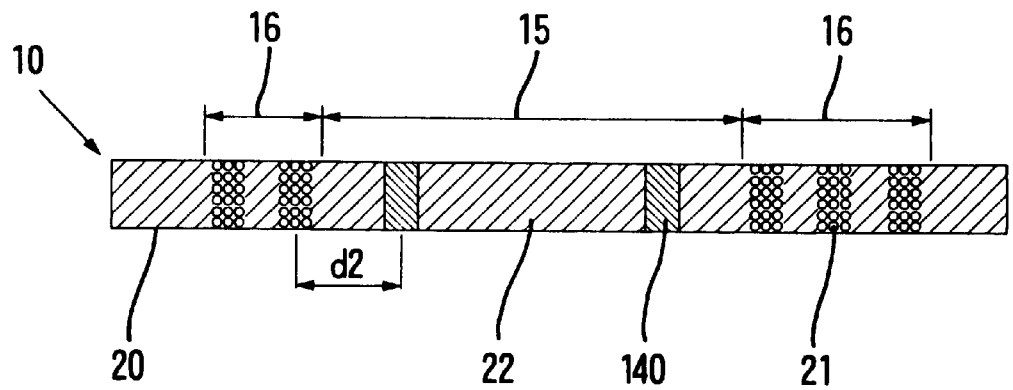
FIG. 44 is a cross-sectional view illustrating another example of the construction of the anisotropically conductive sheet according to the third aspect of the present invention.

FIG. 44 is a cross-sectional view illustrating another example of the construction of the anisotropically conductive sheet according to the third aspect of the present invention. In this anisotropically conductive sheet 10, a plurality of columnar conductive parts 21 for connection each extending in the thickness-wise direction of the sheet is arranged in a state mutually insulated by insulating parts 22, and at least one conductive part 140 for static-charge elimination is arranged about a region 16, in which conductive parts for connection are arranged, in close vicinity to the region 16.

The conductive part 140 for static-charge elimination in this anisotropically conductive sheet 10 is a conductive part (hereinafter referred to as "protective conductive part") mainly having a function that when static electricity generated on the surface of the anisotropically conductive sheet 10 is to be discharged, the discharge is caused at the conductive part 140 for static-charge elimination itself to eliminate static electricity, thereby preventing electrostatic discharge in the conductive parts 21 for connection, and is generally arranged so as to surround a conductive part for connection expected to be particularly affected by static electricity, i.e., a conductive parts for connection located about the region 16, in which the conductive parts for connection are arranged, in close vicinity to the blank region 15 as illustrated in FIG. 35.

An interval that the protective conductive part 140 is arranged varies according to use or size of the resulting anisotropically conductive sheet 10. In the case of an anisotropically conductive sheet used in, for example, electrical inspection of printed circuit boards, the maximum value of a clearance d2 between the protective conductive part 140 and the conductive part for connection closest thereto is preferably at most 1 cm, more preferably at most 5 mm, still more preferably at most 3 mm. When the maximum value of the clearance d2 is at most 1 cm, discharge can be surely caused at the protective conductive part 140, so that an adverse influence of static electricity is not exerted on the conductive parts 21 for connection.

For the same reason, in the case of an anisotropically conductive sheet used in, for example, electrical inspection of semiconductor integrated circuits, the maximum value of a clearance between the protective conductive part and the conductive part for connection closest thereto is preferably at most 1 mm, more preferably at most 500 $\mu$m, still more preferably at most 200 $\mu$m.

The protective conductive part 140 is required to complete discharge without affecting the conductive part 21 for connection from the reason that discharge of static electricity is caused at the protective conductive part 140 to eliminate the static electricity, thereby protecting the conductive part 21 for connection. Therefore, the protective conductive part 140 desirably has an electric resistance value lower than that of the above-described antistatic conductive part 130.

The electric resistance value of the protective conductive part 140 is preferably at most 100 k$\Omega$, more preferably at most 1 k$\Omega$, still more preferably at most 10$\Omega$. When the electric resistance value of the protective conductive part 140 is at most 100 k$\Omega$, discharge can be completed without affecting the conductive part 21 for connection.

The construction of the protective conductive part 140 is basically the same as the above-described antistatic conductive part 130. For example, it may be constructed by dispersing a conductive substance in a base material composed of a polymeric substance. As the conductive substance in the protective conductive part 140, metal particles or conductive metal oxide is preferably used. By these materials, a conductive part for static-charge elimination having the above-described electric resistance value can be formed.

Such an anisotropically conductive sheet 10 can be produced in accordance with the above-described Process (i) or (ii).

In the above-described Process (i), it is only necessary to make through-holes 20H in the sheet member 20 about the region 16, in which the conductive parts for connection are arranged, according to the arrangement pattern of the protective conductive parts 140 to be formed.

In the above-described Process (ii), it is only necessary to arrange preformed materials for protective conductive part at positions corresponding to the arrangement pattern of the protective conductive parts 140 to be formed in close vicinity to the periphery of the region in the mold corresponding to the region 16, in which the conductive parts for connection are arranged.

According to the anisotropically conductive sheet 10 described above, the protective conductive part 140 is arranged about a region 16, in which conductive parts for connection are arranged, in close vicinity to the region 16, whereby discharge can be caused at the protective conductive part 140 even when the surface of the anisotropically conductive sheet 10 bears static electricity by repeatedly conducting pressurizing operation and separation operation in, for example, the electrical inspection of circuit devices, and the static electricity is to be discharged, whereby static-charge elimination can be quickly conducted through the protective conductive part 140. As a result, an adverse influence of static electricity on the conductive parts 21 for connection can be excluded, and the electrical inspection can be conducted with high safety.

<<Usage of Anisotropically Conductive Sheet>>

The case where the anisotropically conductive sheet according to the third aspect of the present invention is used as a connector to conduct electrical inspection of circuit devices will hereinafter be described.

Figure 45:
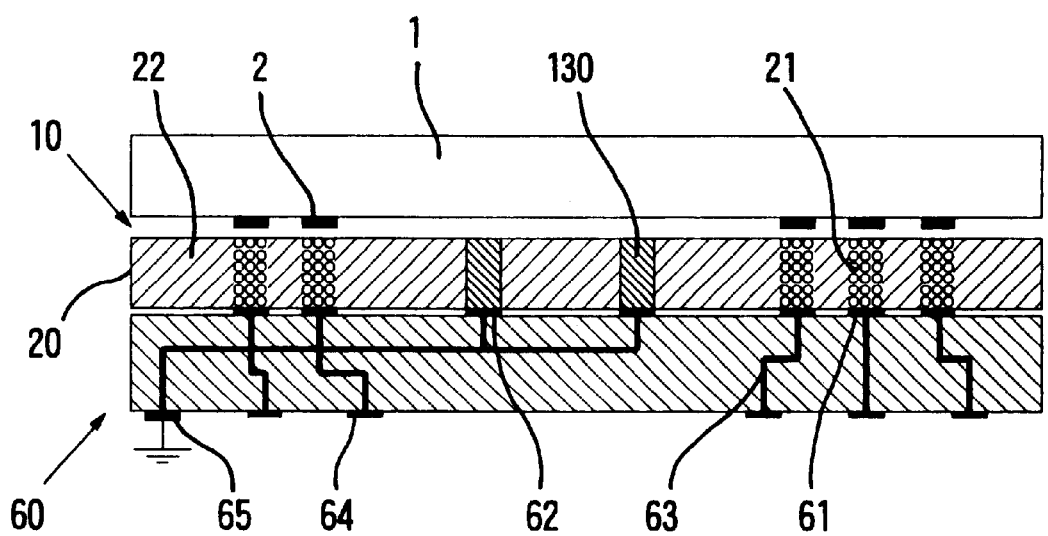
FIG. 45 is a cross-sectional view illustrating a state that the anisotropically conductive sheet shown in FIG. 34 has been interposed between a circuit device which is an inspection subject, and a board.

The electrical inspection of the circuit device is conducted by interposing the anisotropically conductive sheet 10 between a circuit device 1 to be inspected and a board 60 as illustrated in FIG. 45 to achieve electrical connection of the circuit device to be inspected to the circuit board for inspection.

The board 60 has electrodes 61 for connection arranged according to a pattern corresponding to electrodes to be inspected in the circuit device 1 to be inspected, and electrodes 62 for static-charge elimination arranged according to a pattern corresponding to the antistatic conductive parts 130 in the anisotropically conductive sheet 10 on its front surface and has terminal electrodes 64 electrically connected to the electrodes 61 for connection through wiring parts 63 and arranged according to a lattice-point arrangement of, for example, a pitch of 2.54 mm, 1.80 mm or 1.27 mm and a ground terminal 65 electrically connected to the electrodes 62 for static-charge elimination through wiring parts on its back surface.

In this case, as the anisotropically conductive sheet 10, is used that having a structure illustrated in, for example, FIG. 34.

The anisotropically conductive sheet 10 is arranged on the front surface of this board 60 in such a manner that the conductive parts 21 for connection are located on the electrode 61 for connection, and the antistatic conductive parts 130 are located on the electrodes 62 for static-charge elimination, and the circuit device 1 to be inspected is arranged on the anisotropically conductive sheet 10 in such a manner that the electrodes 2 to be inspected come into contact with the conductive parts 21 for connection of the anisotropically conductive sheet 10. The ground terminal 65 in the board 60 is grounded by a proper means to form a static charge-eliminating path.

The whole is pressurized in the thickness-wise direction, whereby active conductive paths extending in the thickness-wise direction of the anisotropically conductive sheet 10 are formed in the conductive parts 21 of the conductive sheet 10. As a result, electrical connection between the electrodes 2 to be inspected in the circuit device 1 to be inspected and the electrodes 61 for connection in the board 60 is achieved. In this state, the prescribed electrical inspection is conducted.

After completion of the electrical inspection of the circuit device 1 to be inspected, the circuit device 1 to be inspected is changed to another circuit device to be inspected, and the same operation as described above is repeated on said circuit device to be inspected, thereby conducting the electrical inspection thereof.

The anisotropically conductive sheet according to the third aspect of the present invention is used as a connector, whereby the accumulation of electric charge on the surface of the anisotropically conductive sheet 10 to bear static electricity is inhibited even when the electrical inspection of a great number of circuit devices is continuously conducted. Therefore, an adverse influence on the inspection apparatus and anisotropically conductive sheet 10 is excluded, and moreover it is unnecessary to stop inspecting operations to conduct static charge-eliminating operation on the anisotropically conductive sheet 10. As a result, the electrical inspection of a great number of circuit devices can be conducted with high time efficiency and safety.

The anisotropically conductive sheets 10 according to the third aspect of the present invention are not limited to the embodiments described above, and various modifications may be added thereto.

Figure 46:
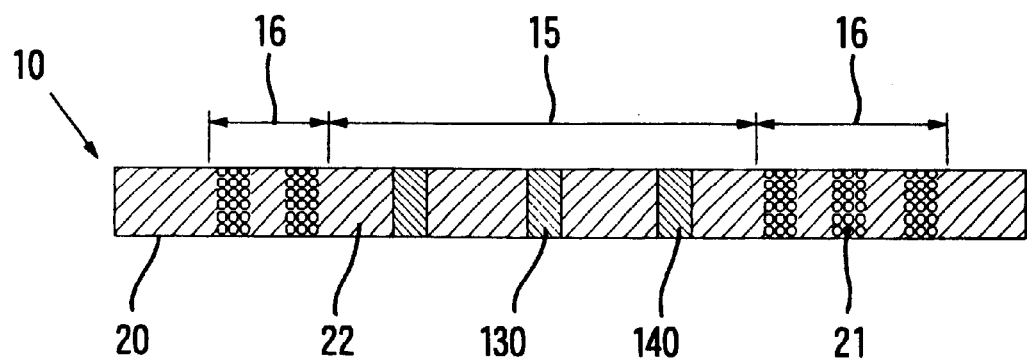
FIG. 46 is a cross-sectional view illustrating an example of the construction of an anisotropically conductive sheet comprising both antistatic conductive parts and protective conductive parts.

For example, both antistatic conductive parts 130 and protective conductive parts 140 may be arranged as illustrated in FIG. 46. According to this anisotropically conductive sheet 10, the surface of the anisotropically conductive sheet 10 can be inhibited from bearing static electricity by the antistatic conductive parts 130, and moreover discharge can be caused at the protective conductive part 140 to eliminate it even when static electricity generated on the surface of the anisotropically conductive sheet 10 is to be discharged. As a result, an adverse influence of static electricity on the conductive parts 21 for connection can be surely excluded.

In this case, there is no need to strictly distinguish the functions of the antistatic conductive part 130 and the protective conductive parts 140 from each other, and it is naturally possible to have both functions.

Figure 47:
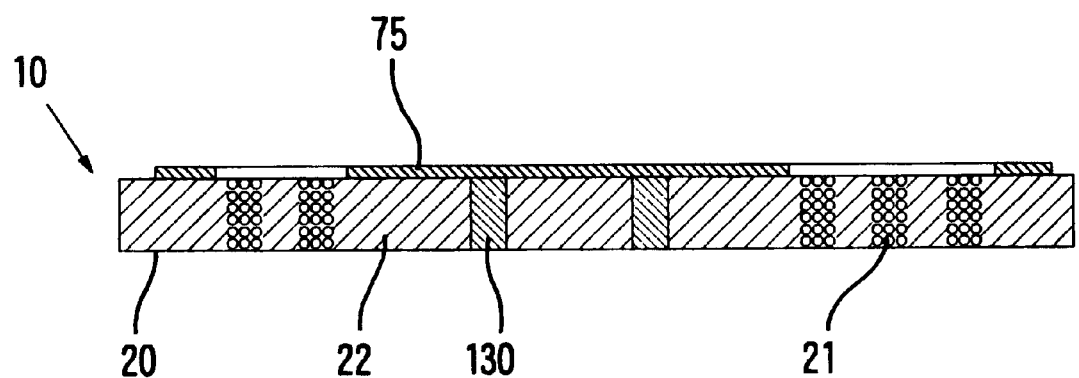
FIG. 47 is a cross-sectional view illustrating an example of the construction of an anisotropically conductive sheet with a layer having conductivity formed on the surface of the anisotropically conductive sheet shown in FIG. 34.

As illustrated in FIG. 47, the anisotropically conductive sheet may be so constructed that a static charge-eliminating layer 75 having conductivity is provided on the surface of the sheet member 20. In this anisotropically conductive sheet 10, a conductive part 130 for static-charge elimination is preferably electrically connected to the static charge-eliminating layer 75.

Figure 48:
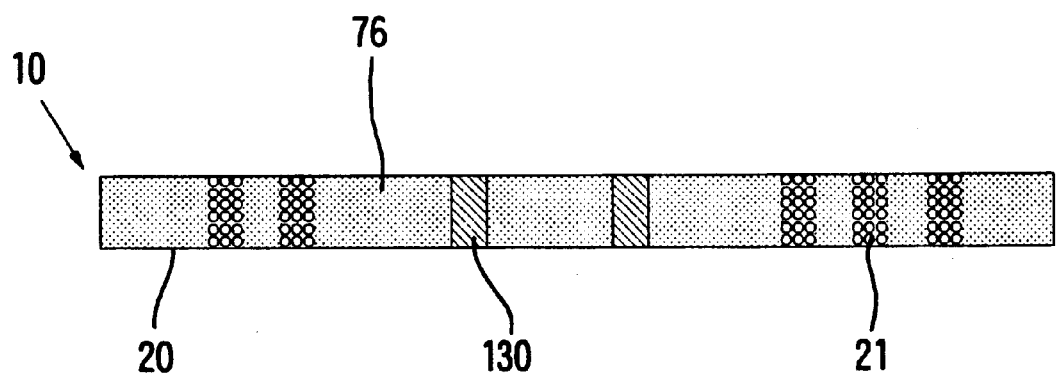
FIG. 48 is a cross-sectional view illustrating an example of the construction of the anisotropically conductive sheet shown in FIG. 34 where all the insulating parts have been substituted with semiconductive parts exhibiting semiconductivity.

As illustrated in FIG. 48, a part or the whole of the insulating parts in the sheet member 20 may be formed by a semiconductive part 76 exhibiting semiconductivity.

The term "semiconductivity" as used herein means that exhibiting a volume resistivity value of $10^{-7}$ to $10^{4}$ Ωm or exhibiting a surface resistivity value of $10^{-1}$ to $10^{10}$ Ω/□ from the viewpoint of the even balance with the thickness of the anisotropically conductive sheet 10.

Still higher antistatic effect can be achieved by adopting such a construction as described above.

The conductive part for static-charge elimination may be formed by orienting, for example, nickel particles in the thickness-wise direction thereof like the conductive part for connection. In this case, a sheet member-forming material is filled into a mold, a parallel magnetic field is applied to the sheet member-forming material in the thickness-wise direction, and the sheet member-forming material is then subjected to a curing treatment, whereby the conductive part for static-charge elimination and the conductive part for connection may be produced by the same process or at the same time. In this case, it is only necessary to add conductive parts to be used as the conductive part for static-charge elimination. Therefore, an anisotropically conductive sheet having such operation and effect as described above may be produced with extreme ease without changing the production process.

In this case, the electric resistance value of the conductive part for static-charge elimination may amount to at least 10 MΩ when it is not pressurized. However, the electric resistivity value is at most 10 MΩ, generally at most 1Ω when it is pressurized. Therefore, electric charge accumulated on the surface of the anisotropically conductive sheet can be kept at a safe level due to the static-charge elimination when pressurized.

The respective conductive parts for connection may be formed in a state projected of the surface of the sheet member.

[Effect of Invention]

The anisotropically conductive sheet may be integrally provided on the surface of a board used in the electrical inspection of, for example, a circuit device.

According to the anisotropically conductive sheet according the first aspect of the present invention, it has the semiconductive parts which exhibit semiconductivity in the plane direction of the sheet, at the surface thereof, the elimination of static charge is conducted through the semiconductive parts by grounding the semiconductive parts, so that the anisotropically conductive sheet is prevented or inhibited from being charged by generation of static electricity on the surface thereof. Accordingly, when the anisotropically conductive sheet is used in electrical inspection of circuit devices such as printed circuit boards and semiconductor integrated circuits, it is unnecessary to stop inspecting operations to conduct static charge-eliminating operation on the anisotropically conductive sheet. As a result, the electrical inspection of circuit devices can be conducted with high time efficiency.

According to the production process of an anisotropically conductive sheet according to the first aspect of the present invention, an anisotropically conductive sheet capable of preventing or inhibiting it from being charged by generation of static electricity on the surface thereof can be produced with ease.

According to the second aspect of the present invention, the static charge-eliminating layer is provided on one surface of the sheet member, so that the anisotropically conductive sheet can be prevented or inhibited from being charged by generation of static electricity on the surface thereof by grounding the static charge-eliminating layer. Therefore, when the anisotropically conductive sheet according to the second aspect of the present invention is used in electrical inspection of circuit devices such as printed circuit boards and semiconductor integrated circuits, it is unnecessary to stop inspecting operations to conduct static charge-eliminating operation on the anisotropically conductive sheet, so that the electrical inspection of circuit devices can be conducted with high time efficiency.

According to the production process of an anisotropically conductive sheet according to the second aspect of the present invention, an anisotropically conductive sheet capable of preventing or inhibiting it from being charged by generation of static electricity on the surface thereof can be produced with ease.

According to the anisotropically conductive sheet according to the third aspect of the present invention, the sheet is connected to a ground through the conductive part for static-charge elimination, so that static electricity generated on the surface of the sheet is electrically neutralized, i.e., eliminated by making it possible to transfer electric charge to the outside through the conductive part for static-charge elimination. As a result, the sheet can inhibit static electricity from being accumulated on the surface thereof, thereby excluding an adverse influent of the static electricity on the conductive part for connection.

Accordingly, when the anisotropically conductive sheet according to the third aspect of the present invention is used as a connector in electrical inspection of circuit devices such a s printed circuit boards and semiconductor integrated circuits, an adverse influent of static electricity on the conductive part for connection is excluded, and moreover it is unnecessary to stop inspecting operations to conduct static charge-eliminating operation on the anisotropically conductive sheet, so that the electrical inspection of circuit devices can be conducted with high time efficiency and high safety.

According to the production process of an anisotropically conductive sheet according to the third aspect of the present invention, an anisotropically conductive sheet capable of excluding an adverse influent of static electricity on the conductive part for connection, and conducting the electrical inspection of circuit devices with high time efficiency and high safety.

What is claimed is:

1. An anisotropically conductive sheet comprising an anisotropically conductive sheet member having conductivity in its thickness-wise direction and a static charge-eliminating layer integrally provided on at least one surface of the sheet member.

2. An anisotropically conductive sheet comprising an anisotropically conductive sheet member provided with a plurality of conductive parts each extending in the thickness-wise direction of the sheet member in a state mutually insulated by insulating parts, and a static charge-eliminating layer provided on at least one surface of each of the insulating parts in the sheet member.

3. The anisotropically conductive sheet according to claim 2, wherein the static charge-eliminating layer is provided on the insulating parts in the sheet member.

4. The anisotropically conductive sheet according to claim 1, wherein the static charge-eliminating layer is composed of a layer containing a conductive organic substance, anine type organic conductive substance, metal or carbon black, a layer of a thermosetting resin or thermoplastic resin containing a conductive substance therein, or a layer formed of a conductive polymer.

5. The anisotropically conductive sheet according to claim 1, wherein the static charge-eliminating layer is formed of a metallic layer.

6. The anisotropically conductive sheet according to claim 1, wherein the static charge-eliminating layer is formed of a layer, which contains a sodium salt of an alkylsulfonic acid.

7. A process for producing the anisotropically conductive sheet according to claim 1, comprises the steps of coating a sheet member with a flowable composition for forming a static charge-eliminating layer, which contains a conductive substance and a binder or a curable material which will become a binder to form a coating film, and then subjecting the coating film to a drying treatment and/or a curing treatment, thereby forming the static charge-eliminating layer.

8. A process for producing the anisotropically conductive sheet according to claim 1, which comprises the steps of bonding a film for static charge-eliminating layer to become a static charge-eliminating layer to a sheet member, thereby forming the static charge-eliminating layer.

9. A connector formed of the anisotropically conductive sheet according claim 1.

10. A method for inspecting a circuit device, which comprises conducting electrical inspection of the circuit 3 device using the connector according to claim 9.

11. An anisotropically conductive sheet comprising an anisotropically conductive sheet member having conductivity in the thickness-wise direction of the sheet member and formed of an elastic polymeric substance, a conductive part for connection to be connected to an external device or terminal of an electronic part, and at least one conductive part for static-charge elimination to be connected to a ground.

12. The anisotropically conductive sheet according to claim 11, wherein the sheet member is provided with a plurality of conductive parts for connection each extending in the thickness-wise direction of the sheet member in a state mutually insulated by insulating parts, and the conductive part for static-charge elimination is arranged in a blank region outside a region, in which the conductive part for connection is arranged, in the sheet member.

13. The anisotropically conductive sheet according to claim 11, wherein the sheet member is constructed by arranging at least one conductive part for static-charge elimination in a state dispersively in the blank region.

14. The anisotropically conductive sheet according to claim 11, wherein the sheet member is constructed by arranging at least one conductive part for static-charge elimination about the region in which the conductive part for connection is arranged.

15. The anisotropically conductive sheet according to claim 11, wherein the conductive parts for static-charge elimination contains at least one conductive substance selected from among metallic particles, conductive metal oxides, conductive organic substances and carbon black.

16. The anisotropically conductive sheet according to claim 11, wherein the conductive parts for static-charge elimination have the same structure as the conductive part for connection.

17. The anisotropically conductive sheet according to claim 11, wherein the conductive parts for static-charge elimination have the same composition as the conductive part for connection.

18. A connector formed of the anisotropically conductive sheet according claim 11.

19. A method for inspecting a circuit device, which comprises conducting electrical inspection of the circuit device using the connector according to claim 18.

* * * * *